(12) United States Patent
Tsumita et al.

(10) Patent No.: US 11,145,345 B2
(45) Date of Patent: Oct. 12, 2021

(54) STORAGE ELEMENT, SEMICONDUCTOR DEVICE, MAGNETIC RECORDING ARRAY, AND METHOD OF PRODUCING STORAGE ELEMENT

(71) Applicant: TDK CORPORATION, Tokyo (JP)

(72) Inventors: Atsushi Tsumita, Tokyo (JP); Yohei Shiokawa, Tokyo (JP); Eiji Komura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/829,188

(22) Filed: Mar. 25, 2020

(65) Prior Publication Data

US 2020/0312392 A1 Oct. 1, 2020

(30) Foreign Application Priority Data

Mar. 28, 2019 (JP) .............................. JP2019-063308

(51) Int. Cl.
| | |
|---|---|
| *G11C 11/16* | (2006.01) |
| *H01L 43/10* | (2006.01) |
| *H01L 43/12* | (2006.01) |
| *H01L 43/08* | (2006.01) |
| *H01L 27/11597* | (2017.01) |

(52) U.S. Cl.
CPC ...... *G11C 11/161* (2013.01); *H01L 27/11597* (2013.01); *H01L 43/08* (2013.01); *H01L 43/10* (2013.01); *H01L 43/12* (2013.01)

(58) Field of Classification Search
CPC ... G11C 11/161; G11C 11/1675; G11C 11/18; H01L 43/10; H01L 27/11597; H01L 43/08; H01L 43/12; H01L 43/06; H01L 43/14; H01L 27/228
See application file for complete search history.

(56) References Cited

U.S. PATENT DOCUMENTS

| | | | |
|---|---|---|---|
| 8,350,347 B2 | 1/2013 | Gaudin et al. | |
| 2012/0032289 A1* | 2/2012 | Ohmori | H01L 27/228 257/427 |

(Continued)

FOREIGN PATENT DOCUMENTS

| | | |
|---|---|---|
| JP | 2017-216286 A | 12/2017 |
| WO | 2016/021468 A1 | 2/2016 |

OTHER PUBLICATIONS

Kato et al.; "Observation of the Spin Hall Effect in Semiconductors;" Science; 2004; pp. 1910-1913; vol. 306.

(Continued)

*Primary Examiner* — Tri M Hoang
(74) *Attorney, Agent, or Firm* — Oliff PLC

(57) ABSTRACT

A storage element includes a first ferromagnetic layer; a second ferromagnetic layer; a nonmagnetic layer that is sandwiched between the first ferromagnetic layer and the second ferromagnetic layer in a first direction; a first wiring which extends in a second direction different from the first direction, and the first wiring being configured to sandwich the first ferromagnetic layer with the nonmagnetic layer in the first direction; an electrode which sandwiches the second ferromagnetic layer at least partially with the nonmagnetic layer in the first direction; and a compound part which is positioned inside the electrode and has a lower thermal conductivity than the electrode.

19 Claims, 19 Drawing Sheets

(56) References Cited

U.S. PATENT DOCUMENTS

2015/0348606 A1    12/2015   Buhrman et al.
2017/0222135 A1    8/2017   Fukami et al.
2018/0114898 A1*   4/2018   Lee .................... G11C 11/1675

OTHER PUBLICATIONS

Miron et al.; "Perpendicular switching of a single ferromagnetic layer induced by in-plane current injection;" Nature; 2011; pp. 189-194; vol. 476.

Liu et al.; Spin torque switching with the giant spin Hall effect of tantalum; Science; 2012; vol. 336.

Liu et al.; "Current-Induced Switching of Perpendicularly Magnetized Magnetic Layers Using Spin Torque from the Spin Hall Effect;" Physical Review Letters; 2012; pp. 1-5; vol. 109; No. 096602.

Lee et al.: Threshold current for switching of a perpendicular magnetic layer induced by spin Hall effect; Applied Physics Letters; 2013; pp. 1-17; vol. 102, No. 112410.

Lee et al.; "Thermally activated switching of perpendicular magnet by spin-orbit spin torque;" Applied Physics Letters; 2014; pp. 1-5; vol. 104, No. 072413.

Fukami et al.; "Magnetization switching by spin-orbit torque in an antiferromagnet-ferromagnet bilayer system;" Nature Materials; 2016; pp. 535-542; vol. 15.

Fukami et al.; "A spin-orbit torque switching scheme with collinear magnetic easy axis and current configuration;" Nature Nanotechnology; 2016; pp. 1-6; vol. 11.

Takahashi et al.; "Spin injection and detection in magnetic nanostructures;" Physical Review B; 2003; pp. 1-4; vol. 67, No. 052709.

Seo et al.; "Area-Efficient SOT-MRAM With a Schottky Diode;" IEEE Electron Device Letters; 2016; pp. 982-985; vol. 37, No. 8.

Zhang et al.; "Spin Hall Effects in Metallic Antiferromagnets;" Physical Review Letters; 2014; pp. 1-6; vol. 113, No. 196602.

* cited by examiner

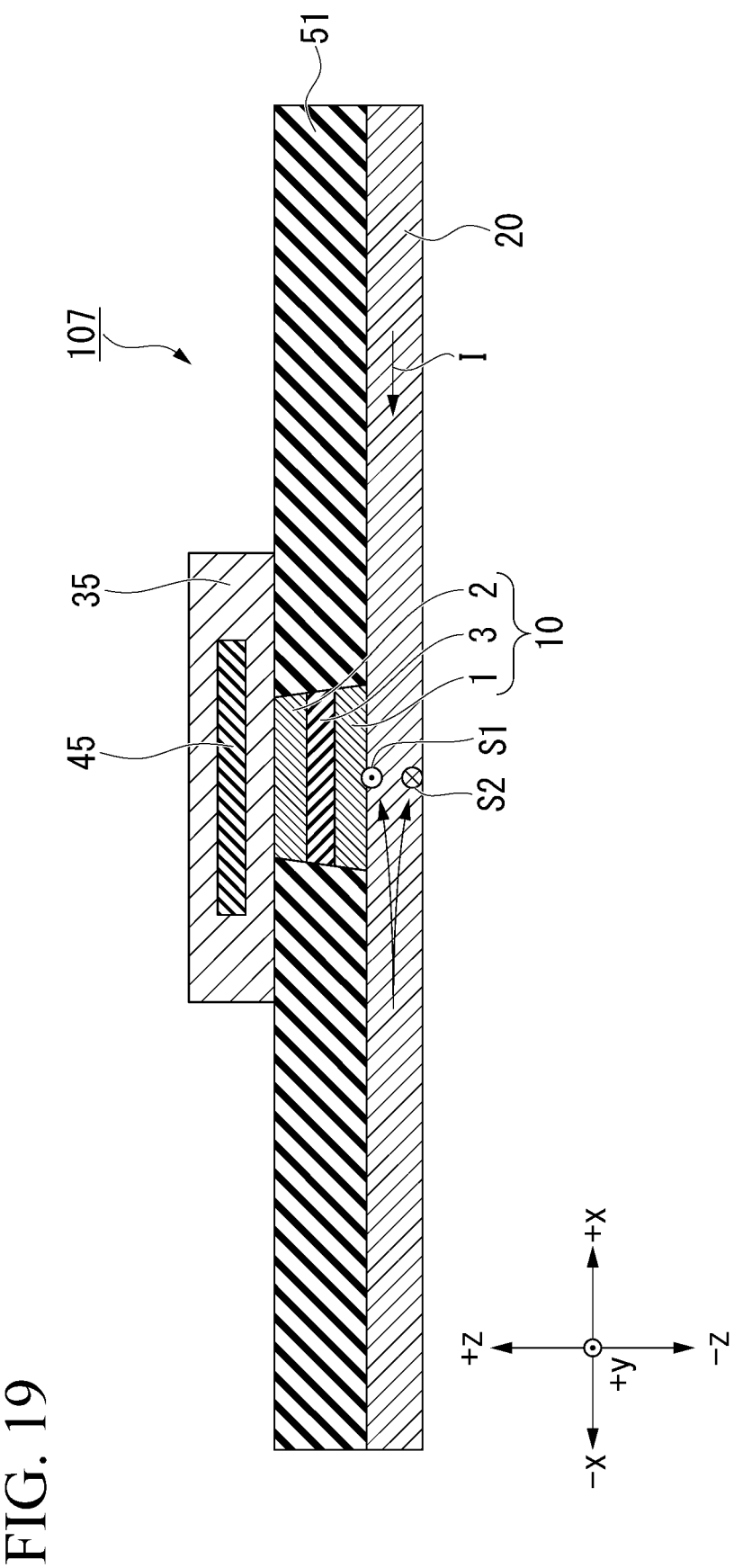

STORAGE ELEMENT, SEMICONDUCTOR DEVICE, MAGNETIC RECORDING ARRAY, AND METHOD OF PRODUCING STORAGE ELEMENT

BACKGROUND OF THE INVENTION

Field of the Invention

The present invention relates to a storage element, a semiconductor device, a magnetic recording array and a method of producing a storage element. Priority is claimed on Japanese Patent Application No. 2019-063308, filed Mar. 28, 2019, the content of which is incorporated herein by reference.

Description of Related Art

A giant magnetoresistance (GMR) element made of a multi-layer film including a ferromagnetic layer and a nonmagnetic layer and a tunnel magnetoresistance (TMR) element using an insulating layer (tunnel barrier layer, barrier layer) as a nonmagnetic layer are known as magnetoresistance effect elements. Magnetoresistance effect elements can be applied to a magnetic sensor, a high frequency component, a magnetic head and a non-volatile random access memory (MRAM).

The MRAM is a storage element in which magnetoresistance effect elements are integrated. The MRAM reads and writes data using a characteristic in which, when directions of magnetizations of two ferromagnetic layers with a nonmagnetic layer therebetween in a magnetoresistance effect element change, the resistance of the magnetoresistance effect element changes. The magnetization direction of the ferromagnetic layer is controlled using, for example, a magnetic field generated by a current. In addition, for example, the direction of the magnetization of the ferromagnetic layer is controlled using a spin transfer torque (STT) generated when a current flows in a lamination direction of the magnetoresistance effect element.

When the magnetization direction of the ferromagnetic layer is rewritten using an STT, a current flows in the lamination direction of the magnetoresistance effect element. A write current causes deterioration of characteristics of the magnetoresistance effect element.

In recent years, methods in which there is no need to cause a current to flow in the lamination direction of the magnetoresistance effect element during writing have been focused upon. One of the methods is a writing method using a spin-orbit-torque (SOT) (for example, Patent Document 1). An SOT is induced by a spin current that is generated by a spin-orbit interaction or the Rashba effect at an interface between different materials. A current for inducing an SOT in a magnetoresistance effect element flows in a direction crossing the lamination direction of magnetoresistance effect elements. That is, there is no need to cause a current to flow in the lamination direction of magnetoresistance effect elements, and a longer lifespan for magnetoresistance effect elements can be expected.

[Patent Document]

[Patent Document 1] Japanese Unexamined Patent Application, First Publication No. 2017-216286

SUMMARY OF THE INVENTION

It is known that the switching current density by an SOT is almost the same as the switching current density by an STT. The switching current density is a current density for reversing the magnetization of a magnetoresistance effect element. Since the magnetoresistance effect element stores data according to the magnetization direction, the switching current density is a factor determining an amount of energy required for writing data. Magnetoresistance effect elements are integrated and used as a magnetic memory in many cases. When the switching current density of respective magnetoresistance effect elements increases, power consumption of the magnetic memory increases. There is a need to reduce the switching current density of the magnetoresistance effect element and minimize power consumption of the magnetic memory.

The present invention has been made in view of the above circumstances, and provides a storage element, a semiconductor device, and a magnetic recording array through which it is possible to improve data writing efficiency, and a method of producing a storage element.

In order to address the above problems, the present invention provides the following aspects.

(1) A storage element according to a first aspect includes a first ferromagnetic layer; a second ferromagnetic layer; a nonmagnetic layer that is sandwiched between the first ferromagnetic layer and the second ferromagnetic layer in a first direction; a first wiring which extends in a second direction different from the first direction, and the first wiring being configured to sandwich the first ferromagnetic layer with the nonmagnetic layer in the first direction; an electrode which sandwiches the second ferromagnetic layer at least partially with the nonmagnetic layer in the first direction; and a compound part which is positioned inside the electrode and has a lower thermal conductivity than the electrode.

(2) In the storage element according to the above aspect, the electrode may have a first conductive part and a second conductive part from a position close to the second ferromagnetic layer, the second conductive part may have a higher conductivity than the first conductive part, and the compound part may be positioned between the first conductive part and the second conductive part.

(3) In the storage element according to the above aspect, a first surface of the first conductive part on the side of the electrode may form a recess part that is recessed toward the first wiring with respect to a surface along a boundary between the first conductive part and the second conductive part, and the compound part may be provided in the recess part.

(4) In the storage element according to the above aspect, the first conductive part may include a first part overlapping the second ferromagnetic layer in the first direction and a second part which covers the first part and extends in the second direction.

(5) In the storage element according to the above aspect, at least a part of the second ferromagnetic layer may not overlap the compound part in the first direction.

(6) In the storage element according to the above aspect, the compound part may include a part overlapping the first ferromagnetic layer in the first direction.

(7) In the storage element according to the above aspect, the compound part when viewed in the first direction may sandwich the first ferromagnetic layer in the second direction.

(8) In the storage element according to the above aspect, the compound part when viewed in the first direction may surround the first ferromagnetic layer.

(9) In the storage element according to the above aspect, a first surface of the compound part on the side of the first wiring may be curved.

(10) In the storage element according to the above aspect, the thickness of the compound part at a first position in the first direction may be thicker than the thickness in the first direction at a second position farther from the first ferromagnetic layer than the first position.

(11) In the storage element according to the above aspect, the first wiring may contain any of a metal, an alloy, an intermetallic compound, a metal boride, a metal carbide, a metal silicide, and a metal phosphide which have a function of generating a spin current due to the spin Hall effect when a current flows.

(12) A semiconductor device according to a second aspect includes the storage element according to the above aspect and a plurality of switching elements that are electrically connected to the storage element.

(13) A magnetic recording array according to a third aspect includes a plurality of the storage elements according to the above aspect.

(14) A method of producing a storage element according to a fourth aspect includes a process in which a first conductive layer, a first magnetic layer, a nonmagnetic layer, and a second magnetic layer are sequentially laminated; a process in which the first magnetic layer, the nonmagnetic layer, and the second magnetic layer are processed into a predetermined shape, and a magnetoresistance effect element in which the first ferromagnetic layer, the nonmagnetic layer, and the second ferromagnetic layer are laminated in that order is formed; a process in which the periphery of the magnetoresistance effect element is covered with an insulating layer; a process in which a second conductive layer having a recess part is formed on one surface of the magnetoresistance effect element and the insulating layer; and a process in which the recess part of the second conductive layer is filled with the insulating layer.

According to the storage element, the semiconductor device and the magnetic recording array of the present embodiment, it is possible to improve data writing efficiency. In addition, according to the method of producing a storage element of the present embodiment, it is possible to easily produce a storage element having high data writing efficiency.

BRIEF DESCRIPTION OF THE DRAWINGS

FIG. 19 is a cross-sectional view of a storage element according to a seventh modified example.

DETAILED DESCRIPTION OF THE INVENTION

Figure 1:
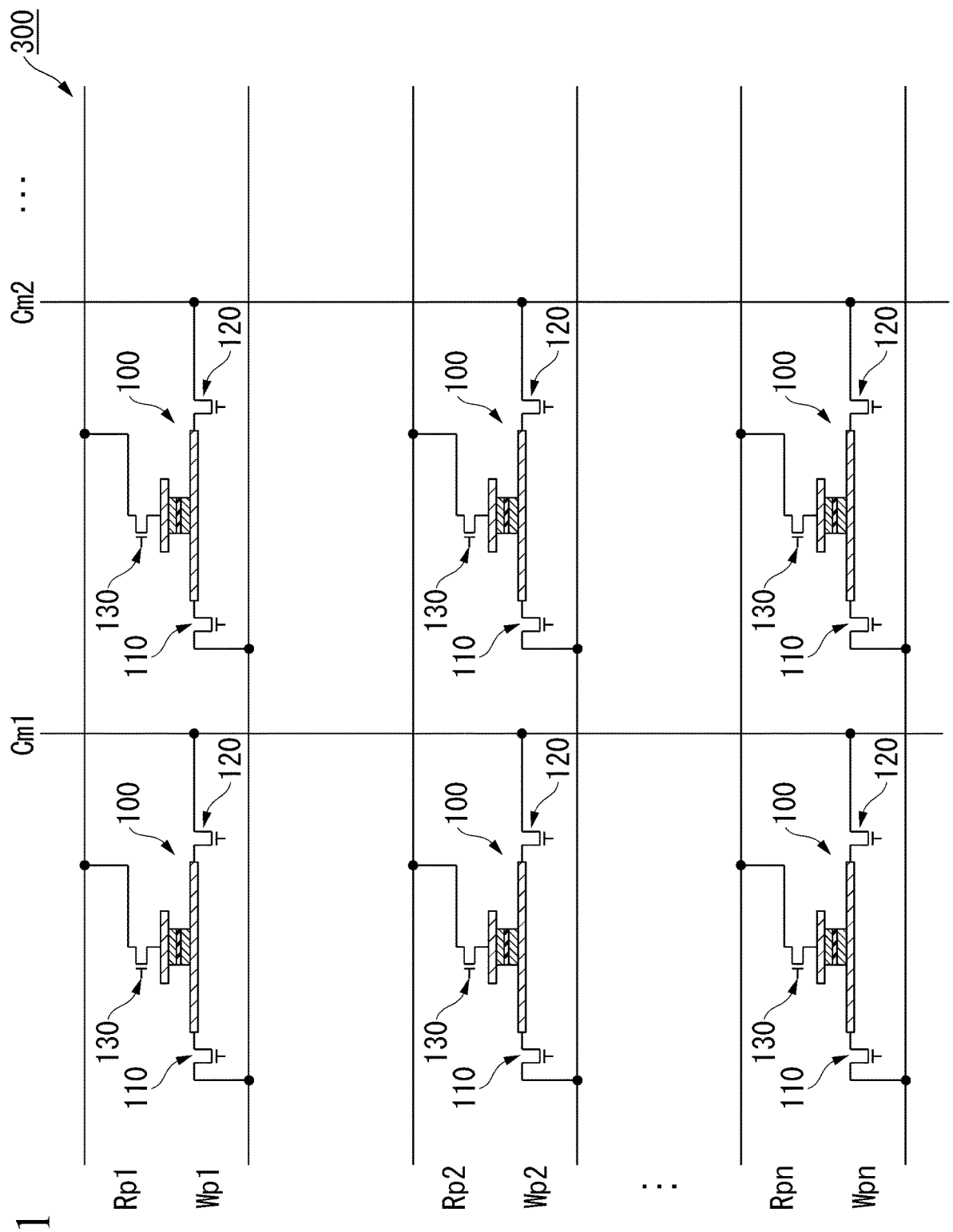
FIG. 1 is a schematic view of a magnetic recording array according to a first embodiment.

The present embodiment will be appropriately described below in detail with reference to the drawings. In the drawings used in the following description, in order to facilitate understanding of features of the present invention, feature parts are enlarged for convenience of illustration in some cases, and size ratios and the like between components may be different from actual components. Materials, sizes, and the like exemplified in the following description are examples not limiting the present invention, and they can be appropriately changed within a range in which effects of the present invention are obtained.

First, directions will be defined. The +x direction, the −x direction, the +y direction, and the −y direction are directions substantially parallel to one surface of a substrate Sub to be described below (refer to FIG. 2). The +x direction is one direction in which a first wiring 20 to be described below extends, and is a direction from a first switching element 110 to a second switching element 120 which will be described below. The −x direction is a direction opposite to the +x direction. When the +x direction and the −x direction are not distinguished, they are simply referred to as "x direction." The x direction is an example of a second direction. The +y direction is one direction orthogonal to the x direction. The −y direction is a direction opposite to the +y direction. When the +y direction and the −y direction are not distinguished, they are simply referred to as "y direction." The +z direction is a direction in which layers of a magnetoresistance effect element 10 to be described below are laminated. The −z direction is a direction opposite to the +z direction. When the +z direction and the −z direction are not distinguished, they are simply referred to as "z direction." The z direction is an example of a first direction. Hereinafter, the +z direction may be expressed as "upward" and the −z direction may be expressed as "downward." Upward and downward do not always match the direction of gravity.

For example, "extend in the x direction" in this specification means that the size in the x direction is larger than the smallest size in the x direction, the y direction, and the z direction. The same applies to extension in other directions. In this specification, the term "connection" is not limited to physical connection but includes electrical connection. In this specification, the term "facing" is not limited to the case in which two members are in contact with each other but includes the case in which another member is provided between the two members.

First Embodiment

FIG. 1 is a configuration diagram of a magnetic recording array 300 according to a first embodiment. The magnetic recording array 300 includes a plurality of storage elements 100, a plurality of write wirings Wp1 to Wpn, a plurality of common wirings Cm1 to Cmn, a plurality of read wirings Rp1 to Rpn, a plurality of first switching elements 110, a plurality of second switching elements 120, and a plurality of third switching elements 130. The magnetic recording array 300 can be used for, for example, a magnetic memory.

The write wirings Wp1 to Wpn electrically connect a power supply to one or more storage elements 100. The common wirings Cm1 to Cmn are wirings used in both writing and reading of data. The common wirings Cm1 to Cmn electrically connect a reference potential to one or more storage elements 100. The reference potential is, for example, the ground. The common wirings Cm1 to Cmn may be provided in each of the plurality of storage elements 100, and may be provided over the plurality of storage elements 100. The read wirings Rp1 to Rpn electrically connect a power supply to one or more storage elements 100. The power supply is connected to the magnetic recording array 300 during use.

The first switching element 110, the second switching element 120, and the third switching element 130 shown in FIG. 1 are connected to each of the plurality of storage elements 100. The first switching element 110 is connected between each of the storage elements 100 and the write wirings Wp1 to Wpn. The second switching element 120 is connected between each of the storage elements 100 and the common wirings Cm1 to Cmn. The third switching element 130 is connected between each of the storage elements 100 and the read wirings Rp1 to Rpn.

When the first switching element 110 and the second switching element 120 are turned ON, a write current flows between the write wirings Wp1 to Wpn and the common wirings Cm1 to Cmn which are connected to the predetermined storage element 100. When the second switching element 120 and the third switching element 130 are turned ON, a read current flows between the common wirings Cm1 to Cmn and the read wirings Rp1 to Rpn which are connected to the predetermined storage element 100.

The first switching element 110, the second switching element 120, and the third switching element 130 are elements that control the flow of a current. The first switching element 110, the second switching element 120 and the third switching element 130 are, for example, an element using a phase change of a crystal layer such as a transistor and an ovonic threshold switch (OTS), an element using a change in band structure such as a metal insulator transition (MIT) switch, an element using a breakdown voltage such as a Zener diode and an avalanche diode, or an element whose conductivity changes as the atomic position changes.

One of the first switching element 110, the second switching element 120, and the third switching element 130 may be shared with the storage element 100 connected to the same wiring. For example, when the first switching element 110 is shared, one first switching element 110 is provided upstream from the write wirings Wp1 to Wpn. For example, when the second switching element 120 is shared, one second switching element 120 is provided upstream from the common wirings Cm1 to Cmn. For example, when the third switching element 130 is shared, one third switching element 130 is provided upstream from the read wirings Rp1 to Rpn.

Figure 2:
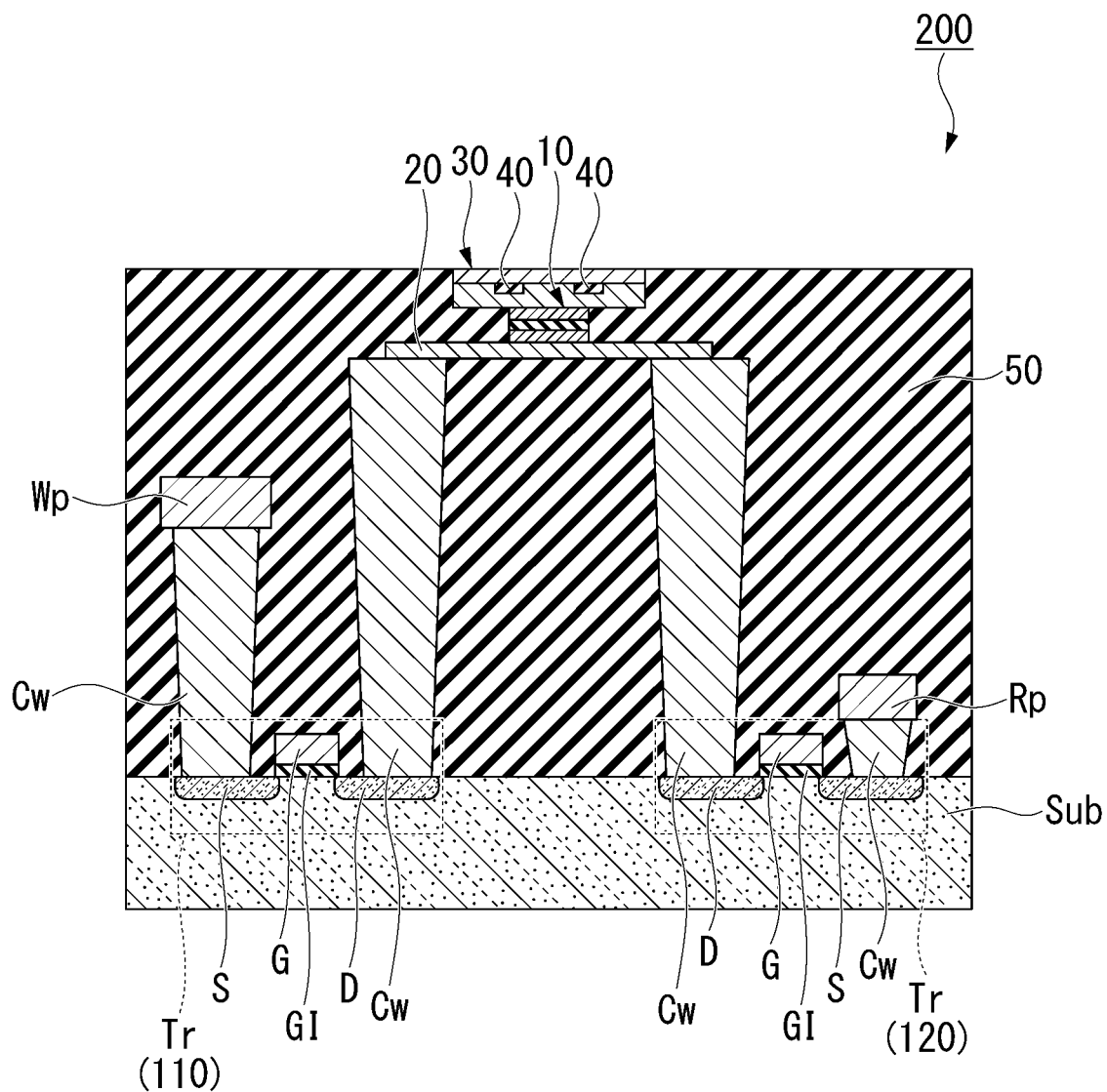
FIG. 2 is a cross-sectional view of a semiconductor device constituting a magnetic recording array according to the first embodiment.

FIG. 2 is a cross-sectional view of a semiconductor device 200 constituting the magnetic recording array 300 according to the first embodiment. FIG. 2 shows a cross section of the storage element 100 cut along an xz plane that passes through the center of the width of the first wiring 20 to be described below in the y direction. The semiconductor device 200 includes the storage element 100, and the plurality of switching elements (the first switching element 110, the second switching element 120, and the third switching element 130) connected to the storage element 100. The third switching element 130 is not present on the cross section shown in FIG. 2, and is positioned, for example, in the depth direction of the paper (−y direction).

The first switching element 110, the second switching element 120, the and third switching element 130 shown in FIG. 2 are transistors Tr. The transistor Tr includes a gate electrode G, a gate insulating film GI, and a source area S and a drain area D which are formed on a substrate Sub. The substrate Sub is, for example, a semiconductor substrate.

Each of the transistors Tr and the storage element 100 are electrically connected via a conductive part Cw. The conductive part Cw may be referred to as, for example, a connection wiring or a via wiring. The conductive part Cw contains a material having conductivity. The conductive part Cw extends in the z direction.

The storage element 100 and the transistor Tr are electrically separated by an insulating layer 50 except for the conductive part Cw. The insulating layer 50 is an insulating layer that insulates between wirings and between elements of a multi-layer. The insulating layer 50 is made of, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), or zirconium oxide ($ZrO_x$).

Figure 3:
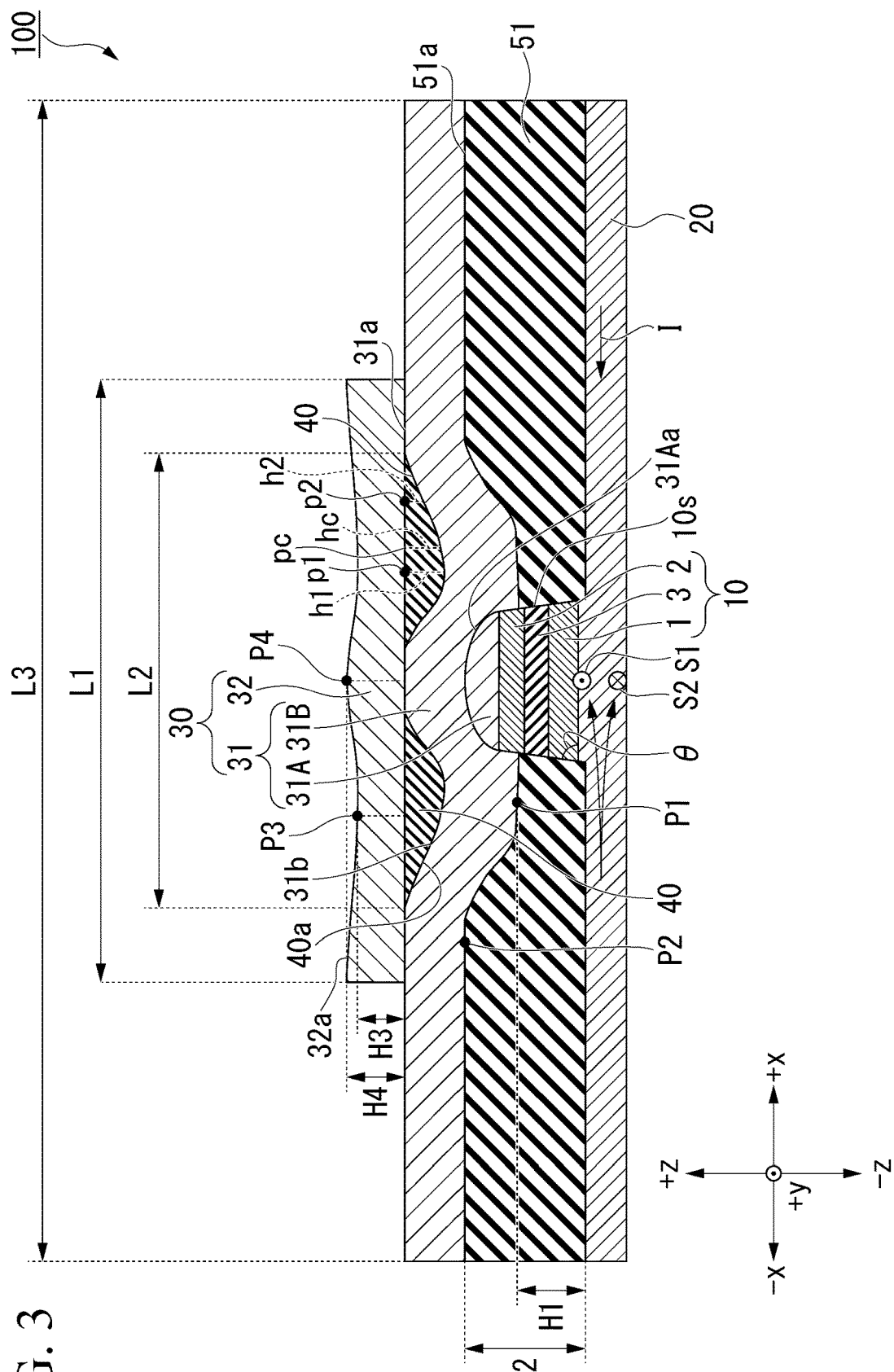
FIG. 3 is a cross-sectional view of a storage element constituting the magnetic recording array according to the first embodiment.
Figure 4:
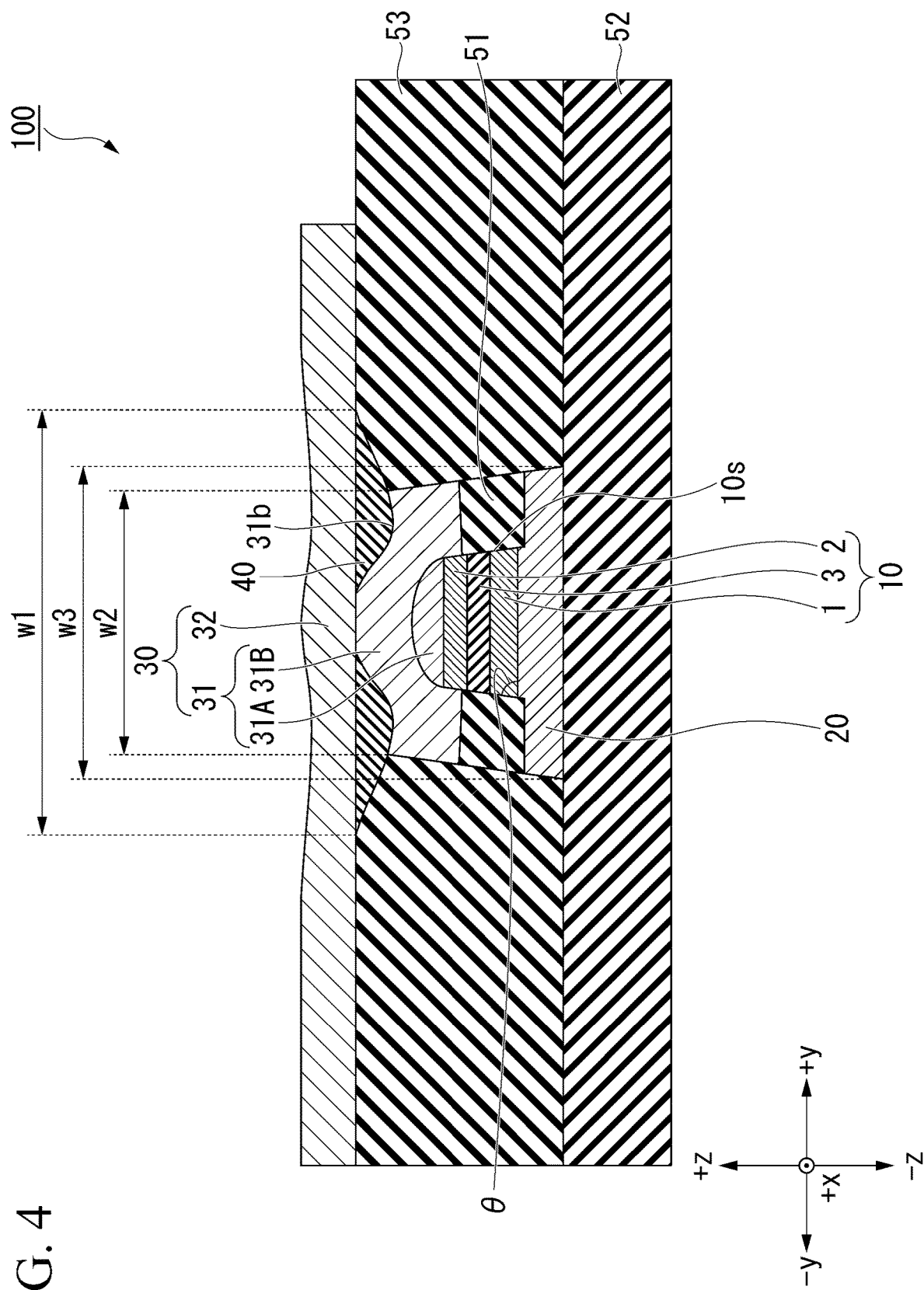
FIG. 4 is a cross-sectional view of the storage element constituting the magnetic recording array according to the first embodiment.
Figure 5:
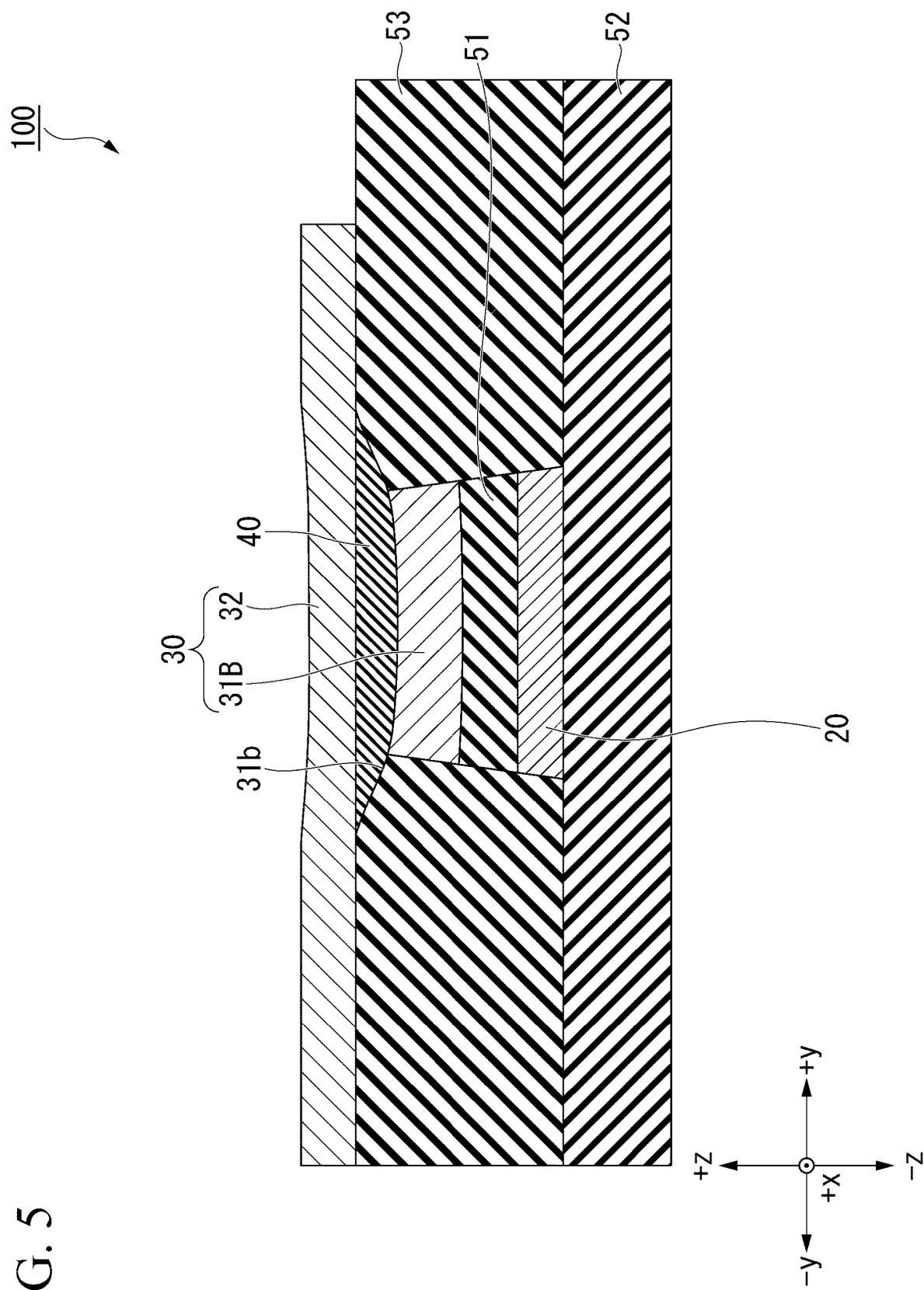
FIG. 5 is a cross-sectional view of the storage element constituting the magnetic recording array according to the first embodiment.
Figure 6:
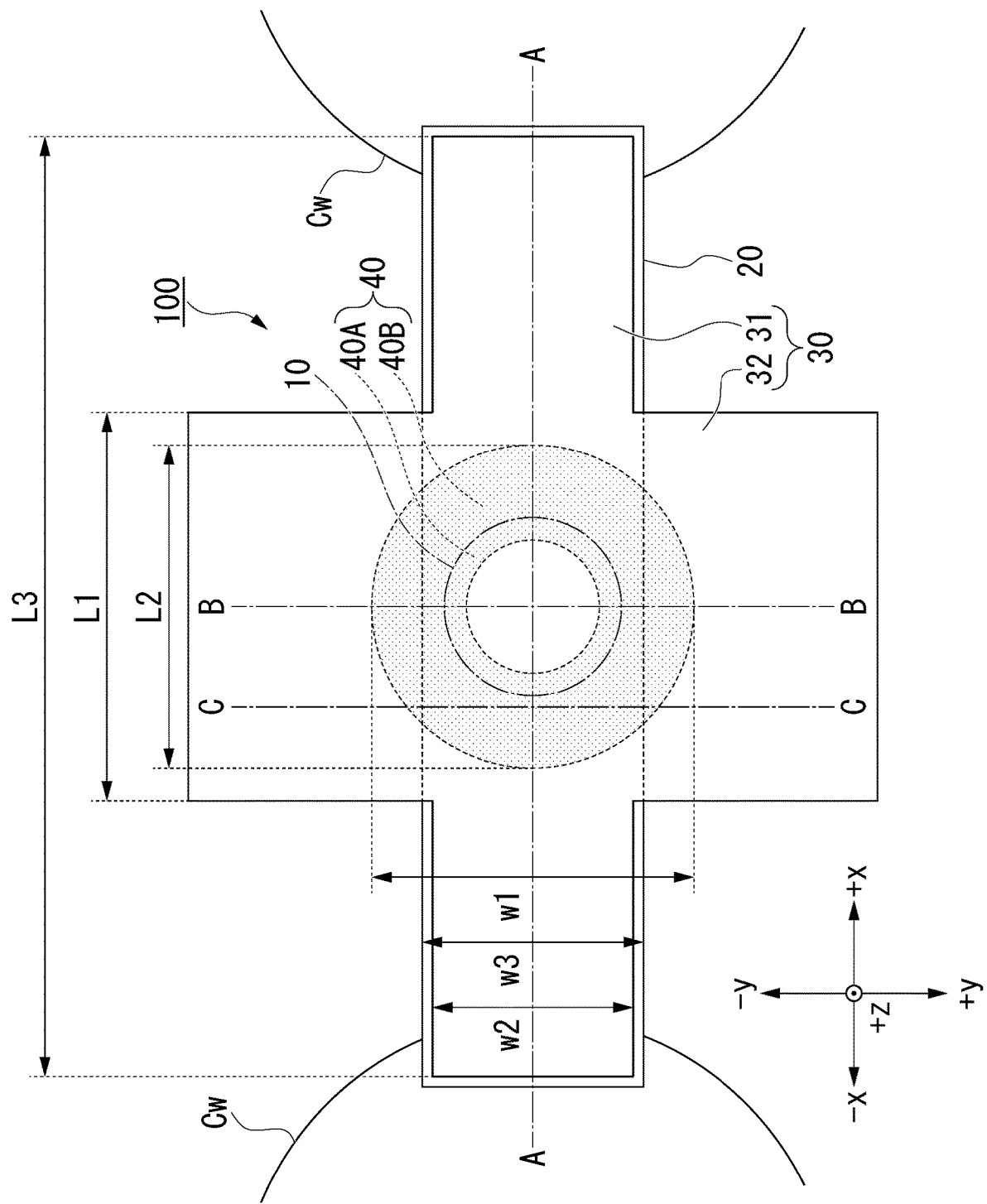
FIG. 6 is a plan view of the storage element constituting the magnetic recording array according to the first embodiment.

FIG. 3 to FIG. 5 are cross-sectional views of the storage element 100 constituting the magnetic recording array 300 according to the first embodiment. FIG. 6 is a plan view of the storage element 100 constituting the magnetic recording array 300 according to the first embodiment. FIG. 3 shows a cross section cut along the xz plane (plane along the line A-A in FIG. 6) that passes through the center of the width of the first wiring 20 in the y direction. FIG. 4 shows a cross section cut along the yz plane (plane along the line B-B in FIG. 6) that passes through the center of the width of the magnetoresistance effect element 10 in the x direction. FIG. 5 shows a cross section cut along the yz plane (plane along the line C-C in FIG. 6) that passes through a center position pc (refer to FIG. 3) of a compound part 40 to be described below.

The storage element 100 includes the magnetoresistance effect element 10, the first wiring 20, an electrode 30, and the compound part 40. Insulating layers 51, 52, and 53 in FIG. 3 to FIG. 5 are a part of the insulating layer 50 in FIG. 2. The storage element 100 is an element that performs magnetization rotation using spin-orbit-torque (SOT), and is referred to as a spin-orbit-torque magnetization rotation element, a spin-orbit-torque magnetization reversal element, or a spin-orbit-torque magnetoresistance effect element.

The magnetoresistance effect element 10 is sandwiched between the first wiring 20 and the electrode 30. The magnetoresistance effect element 10 is, for example, a columnar component having a circular shape in a plan view in the z direction. The shape of the magnetoresistance effect element 10 in a plan view in the z direction is not limited to a circular shape, but may be, for example, an elliptical shape or a rectangular shape. For example, the outer circumferential length or diameter of the magnetoresistance effect element 10 increases as the distance from the electrode 30 increases. For example, a side surface 10s of the magnetoresistance effect element 10 is inclined at a tilt angle θ with respect to the xy plane.

The magnetoresistance effect element 10 includes a first ferromagnetic layer 1, a second ferromagnetic layer 2, and a nonmagnetic layer 3. The first ferromagnetic layer 1 faces the first wiring 20. The second ferromagnetic layer 2 faces the electrode 30. The nonmagnetic layer 3 is sandwiched between the first ferromagnetic layer 1 and the second ferromagnetic layer 2.

The first ferromagnetic layer 1 and the second ferromagnetic layer 2 each have a magnetization. The orientation direction of the magnetization of the second ferromagnetic layer 2 is less likely to change than the magnetization of the first ferromagnetic layer 1 when a predetermined external force is applied. The first ferromagnetic layer 1 is called a magnetization free layer and the second ferromagnetic layer 2 is called a magnetization fixed layer or a magnetization reference layer. The resistance value of the magnetoresistance effect element 10 changes according to a difference in the relative angle between magnetizations of the first ferromagnetic layer 1 and the second ferromagnetic layer 2 with the nonmagnetic layer 3 therebetween. The magnetizations of the first ferromagnetic layer 1 and the second ferromagnetic layer 2 are oriented, for example, in the z direction or any direction in the xy plane.

The first ferromagnetic layer 1 and the second ferromagnetic layer 2 contain a ferromagnetic material. Examples of ferromagnetic materials include a metal selected from the group consisting of Cr, Mn, Co, Fe and Ni, an alloy containing one or more of these metals, and an alloy containing such a metal and at least one or more elements of B, C, and N. The ferromagnetic material is, for example, Co—Fe, Co—Fe—B, Ni—Fe, a Co—Ho alloy, an Sm—Fe alloy, an Fe—Pt alloy, a Co—Pt alloy, or a CoCrPt alloy.

The first ferromagnetic layer 1 and the second ferromagnetic layer 2 may contain a Heusler alloy. A Heusler alloy contains an intermetallic compound having a chemical composition of XYZ or $X_2YZ$. In the periodic table, X is a transition metal element from the Co, Fe, Ni, or Cu groups or a noble metal element, Y is a transition metal from the Mn, V, Cr or Ti groups or an element of type X, and Z is a typical element from Group III to Group V. Examples of Heusler alloys include $Co_2FeSi$, $Co_2FeGe$, $Co_2FeGa$, $Co_2MnSi$, $Co_2Mn_{1-a}Fe_aAl_bSi_{1-b}$, and $Co_2FeGe_{1-c}Ga_c$. Heusler alloys have high spin polarizability.

The magnetoresistance effect element 10 may have an antiferromagnetic layer on the surface of the second ferromagnetic layer 2 opposite to the nonmagnetic layer 3 with a spacer layer therebetween. The second ferromagnetic layer 2, the spacer layer, and the antiferromagnetic layer have a synthetic antiferromagnetic structure (SAF structure). The synthetic antiferromagnetic structure is formed of two magnetic layers with a nonmagnetic layer therebetween. Due to antiferromagnetic coupling between the second ferromagnetic layer 2 and the antiferromagnetic layer, a coercive force of the second ferromagnetic layer 2 becomes larger compared to when there is no antiferromagnetic layer. The antiferromagnetic layer is made of, for example, IrMn or PtMn. The spacer layer contains, for example, at least one selected from the group consisting of Ru, Ir, and Rh.

The magnetoresistance effect element 10 may have a layer other than the first ferromagnetic layer 1, the second ferromagnetic layer 2 and the nonmagnetic layer 3. For example, an underlayer may be provided between the first wiring 20 and the magnetoresistance effect element 10. In addition, for example, a cap layer may be provided between the electrode 30 and the magnetoresistance effect element 10. The underlayer and the cap layer improve the crystallinity of respective layers constituting the magnetoresistance effect element 10.

The first wiring 20 extends in the x direction. For example, the length of the first wiring 20 when viewed in the z direction is longer in the x direction than in the y direction. The first wiring 20 faces the first ferromagnetic layer 1 of the magnetoresistance effect element 10. At least a part of the first wiring 20 sandwiches the first ferromagnetic layer 1 with the nonmagnetic layer 3 in the z direction.

The first wiring 20 contains any of a metal, an alloy, an intermetallic compound, a metal boride, a metal carbide, a metal silicide, and a metal phosphide which have a function of generating a spin current due to the spin Hall effect when a current I flows. The first wiring 20 may be referred to as a spin-orbit-torque wiring.

The spin Hall effect is a phenomenon in which, when a current flows, a spin current is induced in a direction orthogonal to a direction in which the current flows based on a spin-orbit interaction. The spin Hall effect and a general Hall effect are the same in that mobile (moving) charges (electrons) are bent in the direction of motion (movement). In the general Hall effect, a movement direction of charged particles that move in a magnetic field is bent due to a Lorentz force. On the other hand, in the spin Hall effect, a movement direction of a spin is bent only by movement of electrons (only when a current flows) without there being a magnetic field.

The first wiring 20 causes a spin current to be generated due to the spin Hall effect when the current I flows. When the current I flows through the first wiring 20, a first spin S1 directed in one direction and a second spin S2 directed in a direction opposite to that of the first spin S1 are bent in the direction orthogonal to the direction in which the current I flows due to the spin Hall effect. For example, the first spin S1 directed in the +y direction is bent in the +z direction, and the second spin S2 directed in the −y direction is bent in the −z direction.

The number of electrons with the first spin S1 and the number of electrons with the second spin S2 generated due to the spin Hall effect are the same in a nonmagnetic material (a material that is not a ferromagnetic material). That is, the number of electrons with the first spin S1 in the +z direction and the number of electrons with the second spin S2 in the −z direction are the same. The first spin S1 and the second spin S2 flow in a direction in which an uneven distribution of spins is eliminated. In movement of the first spin S1 and the second spin S2 in the z direction, flows of charges are canceled out each other, an amount of currents becomes zero. A spin current that occurs without this current is specifically called a pure spin current.

When a flow of electrons with the first spin S1 is denoted as $J_\uparrow$, a flow of electrons with the second spin S2 is denoted as $J_\downarrow$, and a spin current is denoted as $J_S$, $J_S=J_\uparrow-J_\downarrow$ is defined.

The spin current $J_S$ occurs in the z direction. The first spin S1 is injected into the first ferromagnetic layer 1 that faces the first wiring 20. For example, the first wiring 20 can provide an SOT with which the magnetization of the first ferromagnetic layer 1 can be reversed to the magnetization of the first ferromagnetic layer 1.

The main component of the first wiring 20 is preferably a nonmagnetic heavy metal. A heavy metal refers to a metal having a specific gravity that is equal to or higher than that of yttrium (Y). The nonmagnetic heavy metal is preferably a nonmagnetic metal including d electrons or f electrons in the outmost shell and having a large atomic number of 39 or more. The first wiring 20 is made of, for example, Hf, Ta, or W. A nonmagnetic heavy metal causes a stronger spin-orbit interaction than other metals. The spin Hall effect is caused by a spin-orbit interaction, and spins are likely to be unevenly distributed in the first wiring 20, and a spin current $J_S$ is easily generated.

The first wiring 20 may contain a magnetic metal. The magnetic metal is a ferromagnetic metal or an antiferromagnetic metal. A small amount of a magnetic metal contained in a nonmagnetic material serves as a spin scattering factor. The small amount is, for example, 3% or less of a total molar ratio of elements constituting the first wiring 20. When spins are scattered by the magnetic metal, the spin-orbit interaction is enhanced, and the spin current generation efficiency for a current increases.

The first wiring 20 may contain a topological insulator. A topological insulator is a substance which includes an insulator or a high resistance component therein and has a surface in a spin-polarized metallic state. In this topological insulator, an internal magnetic field is generated due to a spin-orbit interaction. In the topological insulator, a new topological phase is exhibited due to a spin-orbit interaction effect even if there is no external magnetic field. The topological insulator can generate a pure spin current with high efficiency due to a strong spin-orbit interaction and breaking of reversal symmetry at the edge.

The topological insulator is made of, for example, SnTe, $Bi_{1.5}Sb_{0.5}Te_{1.7}Se_{1.3}$, $TlBiSe_2$, $Bi_2Te_3$, or $Bi_{1-x}Sb_x$, $(Bi_{1-x}Sb_x)_2Te_3$. Such a topological insulator can generate a spin current with high efficiency.

The electrode 30 faces the second ferromagnetic layer 2 of the magnetoresistance effect element 10. For example, the electrode 30 is in contact with a first surface and a side surface of the second ferromagnetic layer 2. The first surface is a surface of the second ferromagnetic layer 2 opposite to the nonmagnetic layer 3. At least a part of the electrode 30 sandwiches the second ferromagnetic layer 2 with the nonmagnetic layer 3.

The electrode 30 has, for example, a first conductive part 31 and a second conductive part 32. The first conductive part 31 is positioned closer to the magnetoresistance effect element 10 than the second conductive part 32.

The first conductive part 31 includes, for example, a first part 31A and a second part 31B. The first conductive part 31 is, for example, a part of a hard mask used in a process of producing the storage element 100. For example, the first conductive part 31 is harder than the second conductive part 32. The first part 31A is, for example, a part of a first hard mask used when the magnetoresistance effect element 10 is processed into a predetermined shape. The second part 31B is, for example, a part of a second hard mask used when the first wiring 20 is processed into a predetermined shape. The first part 31A and the second part 31B contain, for example, Al, Cu, Ta, Ti, Zr, NiCr, a nitride (for example, TiN, TaN, SiN), and an oxide (for example, $SiO_2$). The first part 31A and the second part 31B each are, for example, a laminate of NiCr and Ta.

The first part 31A is located at a position overlapping the second ferromagnetic layer 2 in the z direction. For example, the first part 31A has a curved first surface 31Aa farther from the magnetoresistance effect element 10. For example, the first surface 31Aa is curved in a production process to be described below. A read current concentrates from the second part 31B toward the first part 31A. Since the first surface 31Aa is substantially perpendicular to the direction in which a read current flows, a local electrical field concentration can be minimized.

The second part 31B covers the first part 31A. The second part 31B extends in the x direction. The second part 31B is formed along first surfaces 51a and 31Aa of the insulating layer 51 and the first part 31A. The insulating layer 51 has a film thickness H1 in the z direction at a first position P1 which is thinner than a film thickness H2 in the z direction at a second position P2. The first position P1 is a position closer to the magnetoresistance effect element 10 than the second position P2. For example, the film thickness of the insulating layer 51 gradually increases from the first position P1 toward the second position P2. The distance (the same as the film thickness of the insulating layer 51) between the second part 31B and the first wiring 20 at the first position P1 in the z direction is shorter than the distance between the second part 31B and the first wiring 20 at the second position P2 in the z direction. The distance between the second part 31B and the first wiring 20 in the z direction decreases toward the magnetoresistance effect element 10.

The first surface 31a of the first conductive part 31 on the side of the second conductive part 32 forms a recess part 31b that is recessed toward the first wiring 20 with respect to a boundary surface along a boundary between the first conductive part 31 and the second conductive part 32. The recess part 31b is formed on a surface of the second part 31B farther from the first wiring 20. For example, the recess part 31b is formed at a position at which the magnetoresistance effect element 10 is sandwiched in the x direction.

The second conductive part 32 is formed on the first conductive part 31 and the compound part 40 to be described below. For example, the second conductive part 32 is located at a position overlapping the magnetoresistance effect element 10 in the z direction. The second conductive part 32 has higher conductivity than the first conductive part 31. For example, the second conductive part 32 extends in the y direction. For example, the second conductive part 32 is a wiring that connects the first conductive part 31 to the conductive part Cw connected to the third switching element 130. The second conductive part 32 is made of, for example, Cu, Al, or Au.

For example, a length L1 of the second conductive part 32 in the x direction is longer than a distance L2 between the outmost parts of the compound part 40 in the x direction, and shorter than a length L3 of the second part 31B or the first wiring 20 in the x direction. When there are three connection parts between the second conductive part 32 and the first conductive part 31, a read current flows through the three connection parts. When a read current diverges into three paths, a current density at each connection part is reduced and a local electrical field concentration can be minimized. In addition, when a plurality of paths for a read current are secured, it is possible to prevent flow of a read current from stopping even if any of the connection parts is separated due to distortion.

For example, a film thickness H3 of the second conductive part 32 at a third position P3 overlapping the compound part 40 is different from a film thickness H4 at a fourth position P4 not overlapping the compound part 40. The film thickness H4 of the fourth position P4 is thicker than the film thickness H3 of the third position P3. For example, the second conductive part 32 has alternating thick parts and thin parts. For example, a first surface 32a of the second conductive part 32 is curved in a wave shape. When the first surface 32a is curved in a wave shape, adhesion to other layers is improved. In addition, a read current is more likely to flow in thick parts than in thin parts. At the connection part between the second conductive part 32 and the first conductive part 31, the film thickness of the second conductive part 32 is thick and the flow of the read current becomes smooth.

The compound part 40 is positioned inside the electrode 30. For example, the compound part 40 is positioned between the first conductive part 31 and the second conductive part 32. For example, the compound part 40 is formed in the recess part 31b.

The compound part 40 has a lower thermal conductivity than the electrode. The compound part 40 is made of, for example, an oxide, a carbide, a nitride, a sulfide, or a boride. The compound part 40 is made of, for example, $SiO_2$, SiN, MgO, AlN, or BN.

For example, the compound part 40 when viewed in the z direction surrounds the magnetoresistance effect element 10 and surrounds the first ferromagnetic layer 1 (refer to FIG. 6). For example, the compound part 40 when viewed in the z direction has an annular shape centered on the magnetoresistance effect element 10. For example, the compound part 40 when viewed in the z direction sandwiches the first ferromagnetic layer 1 in the x direction and the y direction. For example, the shape of the cut surface of the compound part 40 cut along the yz plane differs depending on the position in the x direction. For example, according to the position in the x direction, the compound part 40 is recognized as two separate parts (refer to FIG. 4), and according to another position, the compound part 40 is recognized as one continuous part (refer to FIG. 5). For example, a width w1 of the compound part 40 in the y direction is wider than a width w2 of the first conductive part 31. In addition, for example, the width w1 of the compound part 40 in the y direction is wider than a width w3 of the first wiring 20 in the y direction.

For example, the compound part 40 when viewed in the z direction includes an overlapping part 40A overlapping the first ferromagnetic layer 1 and a non-overlapping part 40B with no overlapping. When the area of the overlapping part 40A increases, heat is likely to accumulate in the first ferromagnetic layer 1. In addition, for example, at least a part of the second ferromagnetic layer 2 does not overlap the compound part 40 in the z direction. That is, for example, the compound part 40 is not formed on at least a part just above the second ferromagnetic layer 2. A current is less likely to flow in the compound part 40 than the first conductive part 31 and the second conductive part 32. Since there is no compound part 40 just above the second ferromagnetic layer 2, a path for a read current can be secured.

For example, the thickness of the compound part 40 in the z direction differs depending on the position in the x direction or the y direction. A thickness h1 of the compound part 40 at the first position p1 in the z direction is thicker than a thickness h2 at the second position p2 in the z direction. The second position p2 is a position farther from the first ferromagnetic layer 1 than the first position p1. For example, the thickness of the compound part 40 is the maximum at the first position p1. For example, the first position p1 at which the thickness is the maximum is a position closer to the first ferromagnetic layer 1 than the center position pc in the radial direction with respect to the first ferromagnetic layer 1 in the compound part 40. For example, the thickness h1 at the first position p1 in the z direction is thicker than a thickness hc at the center position pc in the z direction. When the thickness of the compound part 40 is thicker at a position close to the first ferromagnetic layer 1, heat can be accumulated in the first ferromagnetic layer 1.

For example, a first surface 40a of the compound part 40 on the side of the first wiring 20 is curved. When the first surface 40a is curved, a local read current concentration can be minimized.

Figure 7:
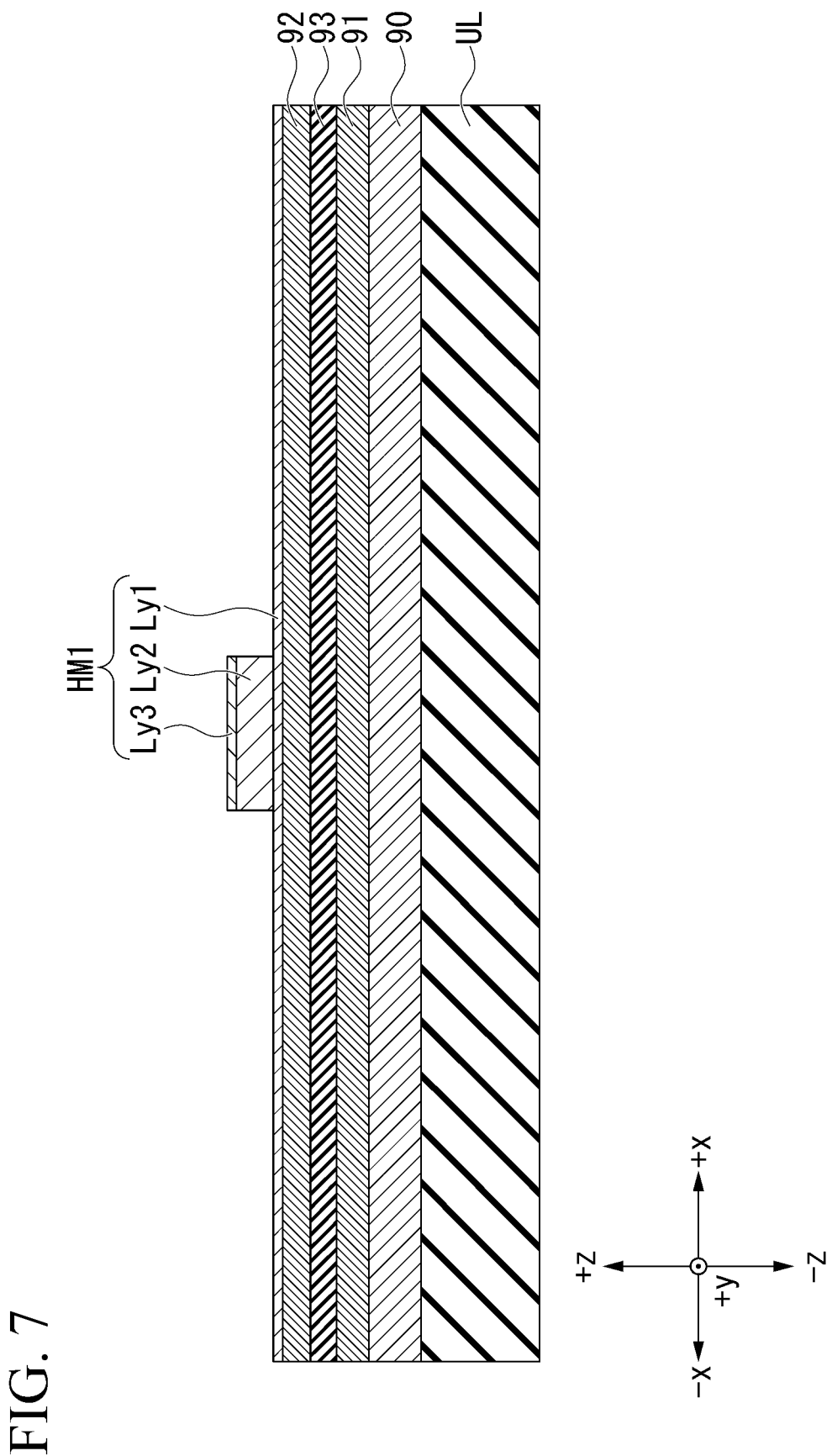
FIG. 7 is a cross-sectional view showing a method of producing a storage element constituting the magnetic recording array according to the first embodiment.

Next, a method of producing the storage element 100 will be described. First as shown in FIG. 7, a conductive layer 90, a magnetic layer 91 (a first magnetic layer), a nonmagnetic layer 93, and a magnetic layer 92 (a second magnetic layer) are sequentially laminated on an underlayer UL. The underlayer UL corresponds to a part positioned below the first wiring 20 in FIG. 2 and includes, for example, the insulating layer 50 and the conductive part Cw. In FIG. 7 to FIG. 11, for convenience, they are collectively illustrated as the underlayer UL. The conductive layer 90, the magnetic layer 91, the nonmagnetic layer 93 and the magnetic layer 92 are laminated using, for example, a sputtering method, a chemical vapor deposition (CVD) method, or an evaporation method.

Next, a layer serving as a first hard mask (a first conductive layer) is laminated on the upper surface of the magnetic layer 92. The layer serving as a first hard mask is processed into a predetermined shape to form a first hard mask HM1. For example, the layer serving as a first hard mask has a first layer Ly1, a second layer Ly2, and a third layer Ly3 in that order from the side close to the magnetic layer 92. For example, the third layer Ly3 is processed into a predetermined shape by milling through a resist. The second layer Ly2 is processed into a predetermined shape by reactive ion etching (RIE) via the third layer Ly3. The first layer Ly1 functions as an RIE stopper layer.

Figure 8:
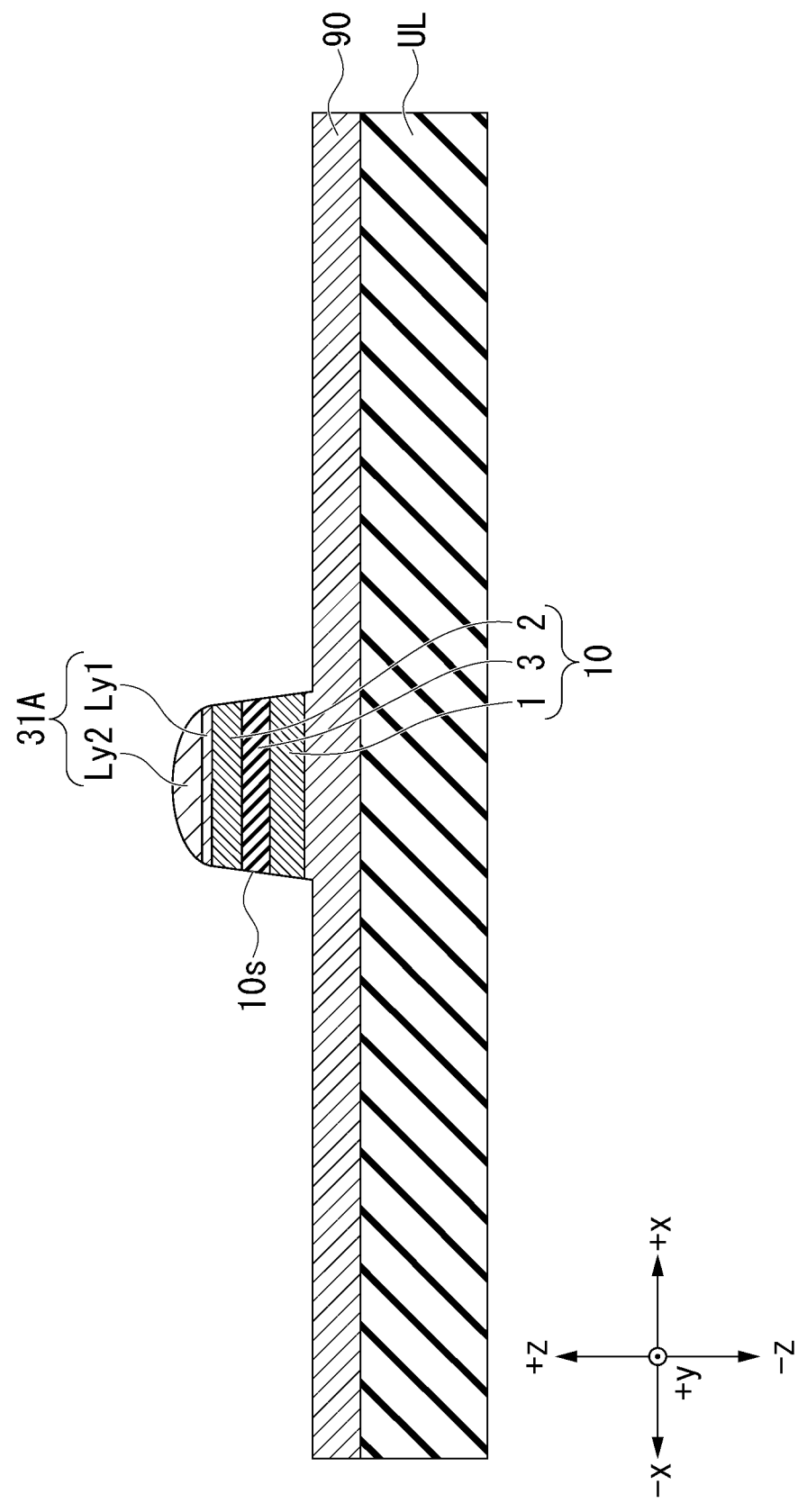
FIG. 8 is a cross-sectional view showing a method of producing a storage element constituting the magnetic recording array according to the first embodiment.

Next, as shown in FIG. 8, the magnetic layer 91, the nonmagnetic layer 93 and the magnetic layer 92 are processed into a predetermined shape (for example, columnar shape). In the magnetic layer 91, the nonmagnetic layer 93 and the magnetic layer 92, a part covered with the second layer Ly2 remains and the other part is removed. During processing, the vicinity of the surface of the conductive layer 90 may be removed together. In addition, during processing, the first layer Ly1 may be processed simultaneously with the magnetic layer 91, the nonmagnetic layer 93 and the magnetic layer 92, and the third layer Ly3 may be removed. The magnetic layer 91, the nonmagnetic layer 93 and the magnetic layer 92 are processed into a first ferromagnetic layer 1, a nonmagnetic layer 3, and a second ferromagnetic layer 2, and the magnetoresistance effect element 10 is formed. The processing is performed by, for example, ion milling. The width of the magnetoresistance effect element 10 in the x direction and the y direction can be reduced due to the first hard mask HM1. The surface of the first hard mask HM1 is curved by processing, and the first hard mask HM1 becomes the first part 31A of the first conductive part 31.

Figure 9:
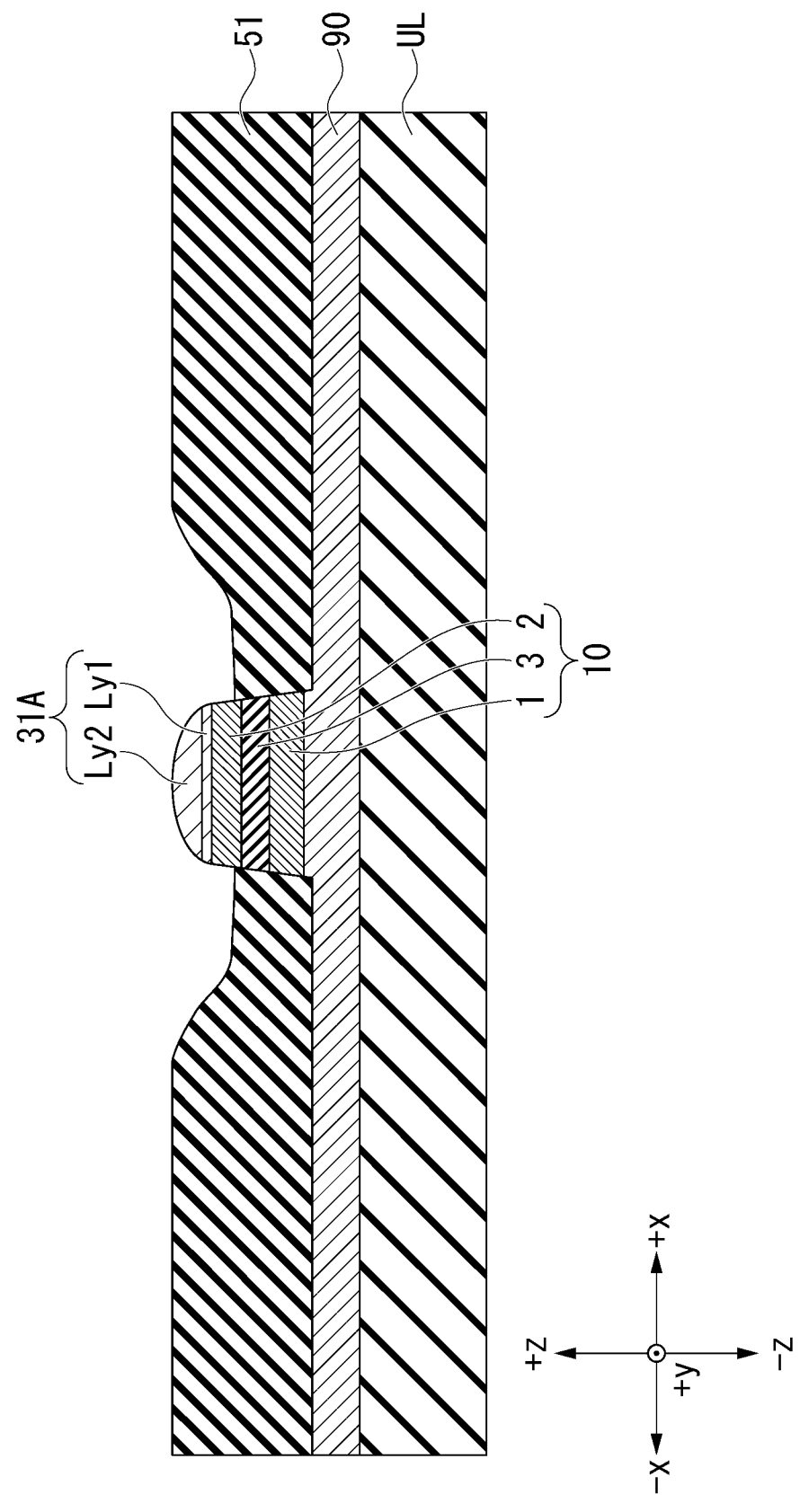
FIG. 9 is a cross-sectional view showing a method of producing a storage element constituting the magnetic recording array according to the first embodiment.

Next, an insulating layer is formed so that it covers the conductive layer 90 and the magnetoresistance effect element 10. First, the insulating layer is formed on one surface of the conductive layer 90 and the magnetoresistance effect element 10. The insulating layer is formed so that a part overlapping the magnetoresistance effect element 10 is raised. The insulating layer is formed of, for example, two layers with different materials (for example, $SiO_2$ and $Al_2O_3$ from the side close to the conductive layer 90). The part raised with respect to other regions of the insulating layer is flattened by, for example, chemical mechanical polishing (CMP). If the insulating layer is formed of two layers, the first layer is a CMP stopper film. Then, as shown in FIG. 9, a part of the insulating layer around the magnetoresistance effect element 10 is removed until the first part 31A of the first conductive part 31 is exposed. The insulating layer is removed by, for example, milling. When a part of the insulating layer is removed, as shown in FIG. 9, in the insulating layer 51, the periphery of the magnetoresistance effect element 10 is more recess than other parts.

Figure 10:
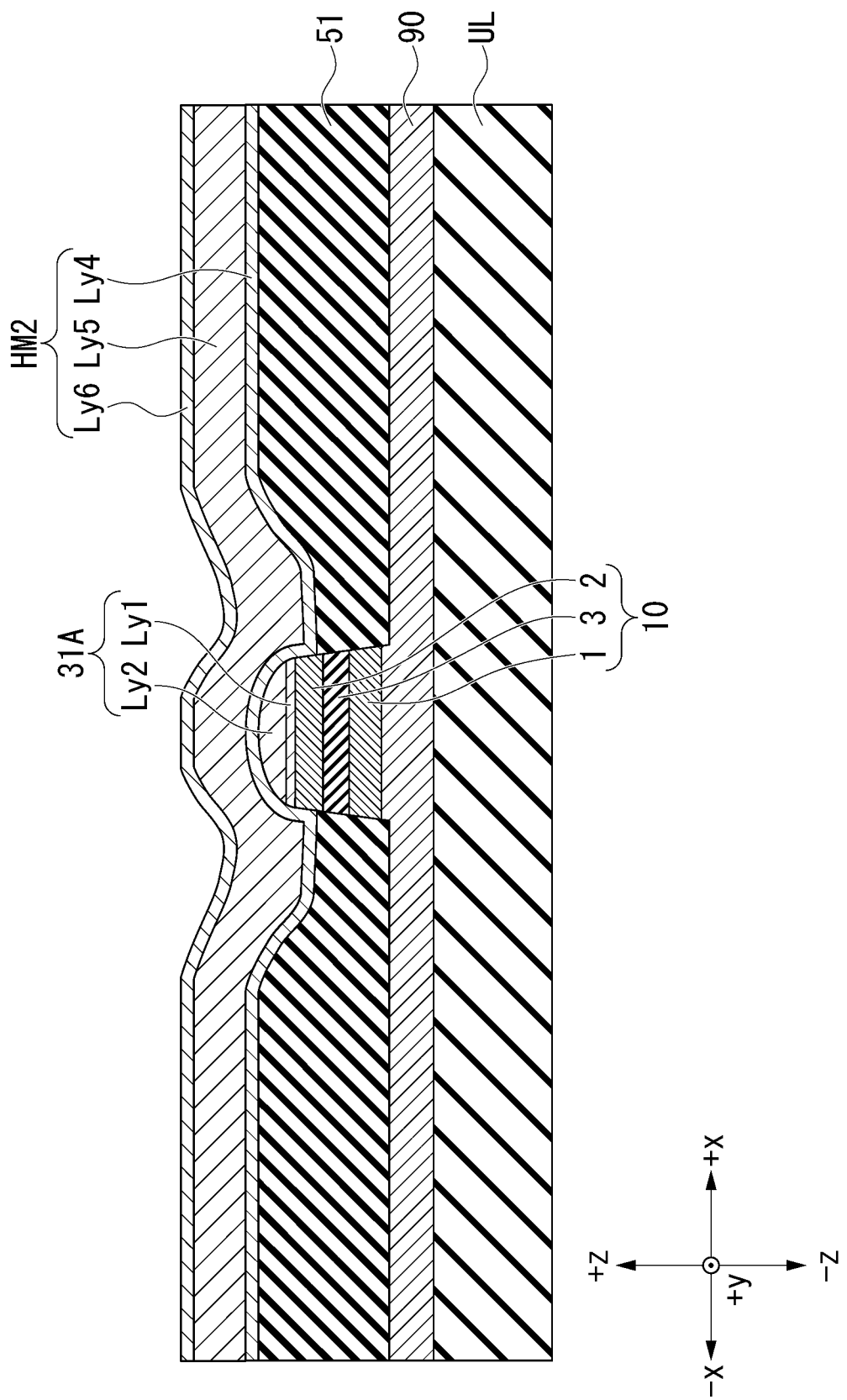
FIG. 10 is a cross-sectional view showing a method of producing a storage element constituting the magnetic recording array according to the first embodiment.

Next, as shown in FIG. 10, a second hard mask HM2 (a second conductive layer) is formed on the upper surface of the insulating layer 51 and the magnetoresistance effect element 10. First, a layer serving as a second hard mask is laminated on the upper surface of the insulating layer 51 and the magnetoresistance effect element 10. The layer serving as a second hard mask is processed into a predetermined shape to form the second hard mask HM2. For example, the layer serving as a second hard mask includes a fourth layer Ly4, a fifth layer Ly5, and a sixth layer Ly6 in that order from the side close to the magnetic layer 92. For example, the sixth layer Ly6 is processed into a predetermined shape by milling through a resist. The fifth layer Ly5 is processed into a predetermined shape by RIE via the sixth layer Ly6. The fourth layer Ly4 functions as an RIE stopper layer.

Next, the conductive layer 90 is patterned into a predetermined shape. In the conductive layer 90, a part covered with the fifth layer Ly5 remains, and the other part is removed. The conductive layer 90 is patterned in the x direction and the y direction to form the first wiring 20. The fourth layer Ly4 may be patterned together with the conductive layer 90, and the sixth layer Ly6 may be removed. The second hard mask HM2 becomes the second part 31B.

Figure 11:
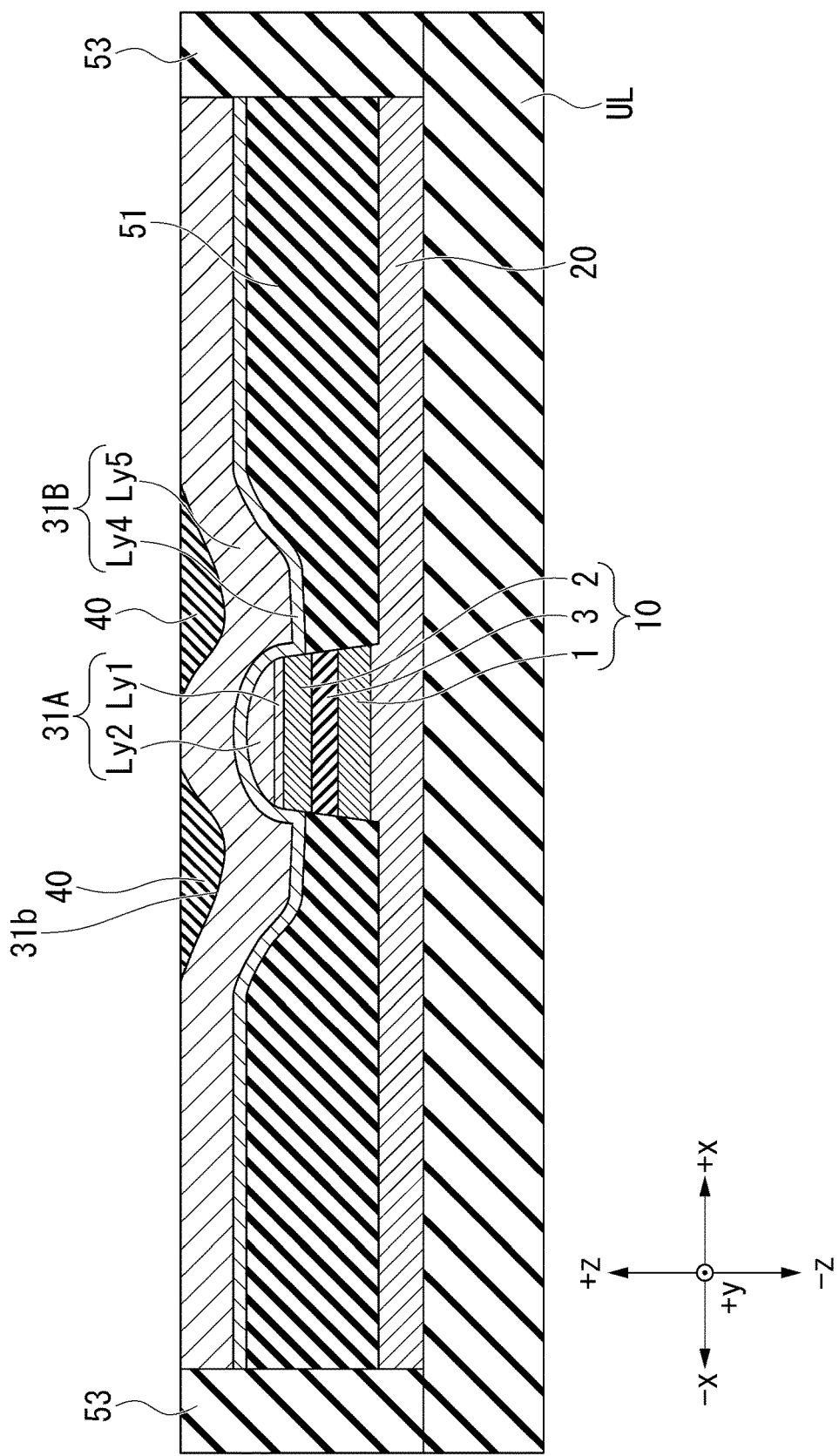
FIG. 11 is a cross-sectional view showing a method of producing a storage element constituting the magnetic recording array according to the first embodiment.

Next, an insulating layer is formed so that it covers the second part 31B and the part removed by patterning. A part of the insulating layer overlapping the second part 31B is raised in the z direction. The insulating layer is formed of, for example, two layers with different materials (for example, $SiO_2$ and $Al_2O_3$ from the side closer to the conductive layer 90). The part raised with respect to other regions of the insulating layer is flattened by, for example, chemical mechanical polishing (CMP). If the insulating layer is formed of two layers, the first layer is a CMP stopper film. Then, a part of the insulating layer is removed until a second part 31B is exposed. The insulating layer is removed by, for example, milling. As shown in FIG. 11, when a part of the insulating layer remains in the recess part 31b, the compound part 40 is formed. In addition, as shown in FIG. 11, a part of the insulating layer becomes the insulating layer 53.

Finally, the second conductive part 32 is formed on the upper surface of the compound part 40 and the second part 31B, and the storage element 100 shown in FIG. 3 is formed. The production process shown here is an example, and other processes may be inserted between processes. In addition, in the above production process, the recess part 31b is naturally formed in the second part 31B using processing during exposure of the first part 31A. However, the recess part 31b may be intentionally formed by patterning or the like.

The storage element 100 of the magnetic recording array 300 according to the present embodiment can improve data writing efficiency. The reason for this will be described below.

Information is written in the storage element 100 according to the following procedures. First, when the first switching element 110 and the second switching element 120 are turned ON, a current I flows through the first wiring 20. When a current flows through the first wiring 20, a spin current is generated due to the spin Hall effect, and spins are injected from the first wiring 20 to the first ferromagnetic layer 1. The injected spins reverse the magnetization of the first ferromagnetic layer 1. When the magnetization direction of the first ferromagnetic layer 1 changes, the resistance value of the magnetoresistance effect element 10 changes, and information is written in the storage element 100.

The first wiring 20 and the magnetoresistance effect element 10 generate heat when the current I flows through the first wiring 20. The magnetization of the first ferromagnetic layer 1 is more strongly oriented in a direction of the easy magnetization axis as the temperature is lower. The heat generated in the first wiring 20 and the magnetoresistance effect element 10 lowers stability of the magnetization of the first ferromagnetic layer 1, and facilitates reversal of the magnetization of the first ferromagnetic layer 1. On the other hand, a metal constituting the electrode 30 has excellent thermal conductivity, and the heat generated in the first wiring 20 and the magnetoresistance effect element 10 is exhausted through the electrode 30. The compound part 40 has a lower thermal conductivity than the electrode 30 and restricts this heat exhaustion. That is, the compound part 40 minimizes escape of heat from the first ferromagnetic layer 1 during writing, and heat is accumulated in the first ferromagnetic layer 1.

As described above, the magnetization of the first ferromagnetic layer 1 is more easily reversed as the temperature is higher. Heat accumulated in the first ferromagnetic layer 1 assists magnetization rotation by spins injected into the first ferromagnetic layer 1. That is, in the storage element 100 according to the first embodiment, the compound part 40 can minimize escape of heat from the first ferromagnetic layer 1, and can efficiently perform magnetization reversal (that is, data writing) of the first ferromagnetic layer 1.

In addition, the storage element 100 reads information according to the following procedures. First, when the third switching element 130 and the second switching element 120 are turned ON, a read current flows through the electrode 30, the magnetoresistance effect element 10, and the first wiring 20 in that order. When the magnetization of the first ferromagnetic layer 1 is reversed during reading of data, the reliability of data decreases. Since a read current is lower than a write current, the magnetization of the first ferromagnetic layer 1 does not reverse in principle. In addition, even if the compound part 40 minimizes escape of heat from the first ferromagnetic layer 1 and stability of the magnetization of the first ferromagnetic layer 1 is lowered, it does not have an influence sufficient to reverse the magnetization of the first ferromagnetic layer 1. In addition, when no compound part 40 is provided just above the magnetoresistance effect element 10, it is possible to prevent the compound part 40 from significantly obstructing the path for a read current.

In addition, the storage element 100 is required to store data stably. The heat generated in the first wiring 20 and the magnetoresistance effect element 10 is generated when the current I flows, and the current I does not flow when data is stored in principle. Therefore, an influence of the compound part 40 on data stability is weak.

While an example of the first embodiment has been described above in detail, the present invention is not limited to the example, and various modifications and alternations can be made in a range within the spirit and scope of the present invention described in the scope of the claims.

First Modified Example

Figure 12:
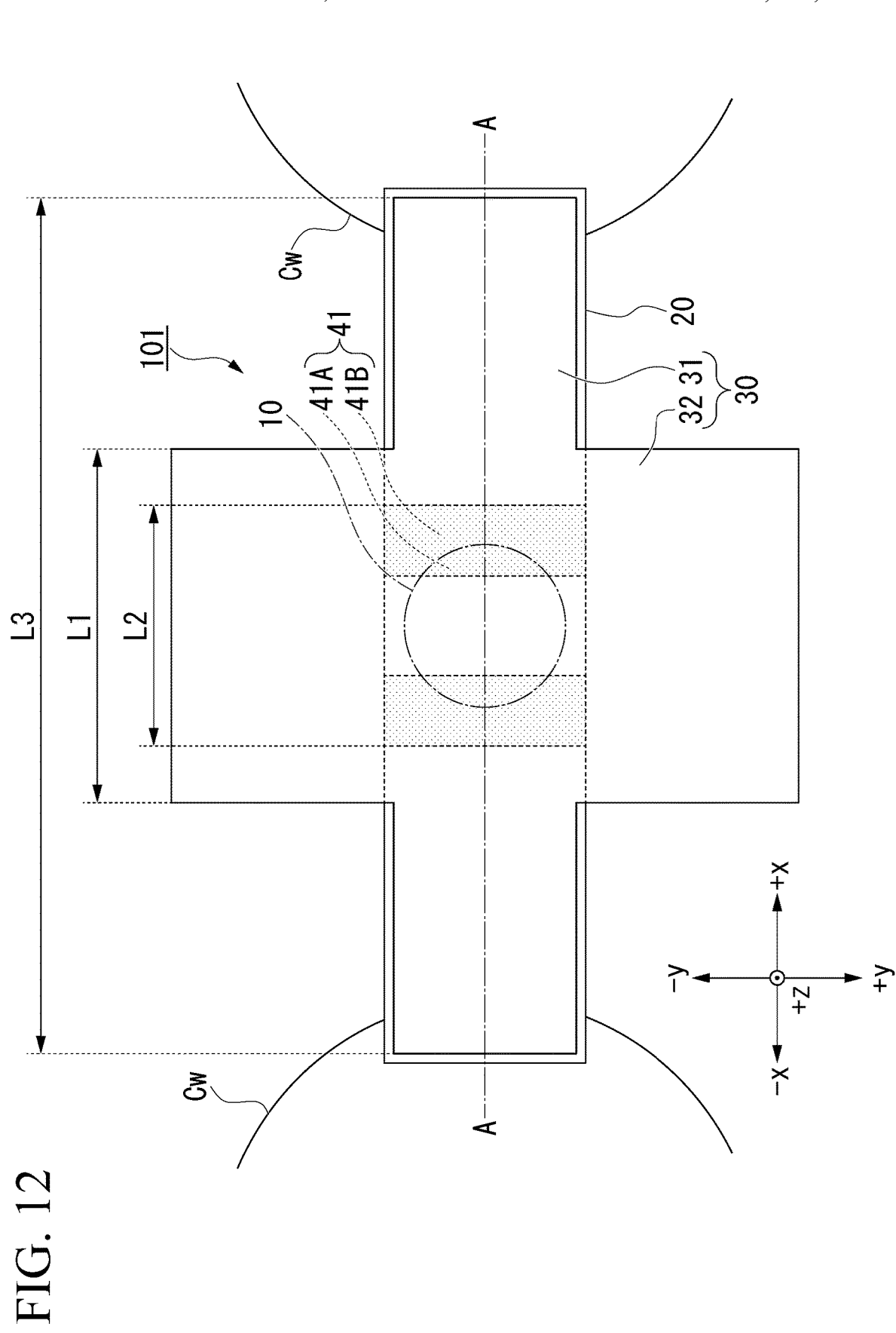
FIG. 12 is a plan view of a storage element according to a first modified example.

FIG. 12 is a plan view of a storage element 101 according to a first modified example. The storage element 101 according to the first modified example is different from the compound part 40 shown in FIG. 4 in the shape of a compound part 41. The other components are the same as those in the storage element 100, the same components are denoted with the same reference numerals and descriptions thereof are omitted.

The compound part 41 is positioned inside the electrode 30. The compound part 41 is different from the compound part 40 in the storage element 100 in that there are two compound parts 41 that extend in the y direction. The other configurations, materials, and the like of the compound part 41 are the same as those of the compound part 40.

The compound part 41 when viewed in the z direction sandwiches the first ferromagnetic layer 1 in the x direction. For example, the compound part 41 when viewed in the z direction includes an overlapping part 41A overlapping the first ferromagnetic layer 1 and a non-overlapping part 41B with no overlapping. The compound part 41 can be formed by, for example, patterning.

A write current flows in the x direction along the first wiring 20. The first wiring 20 is a main heat generation source during writing in the storage element 101. When the compound part 41 is provided at a position at which the first ferromagnetic layer 1 is sandwiched in the x direction, it is possible to minimize escape of heat from the first ferromagnetic layer 1. Therefore, the storage element 101 has excellent data writing efficiency.

Second Modified Example

Figure 13:
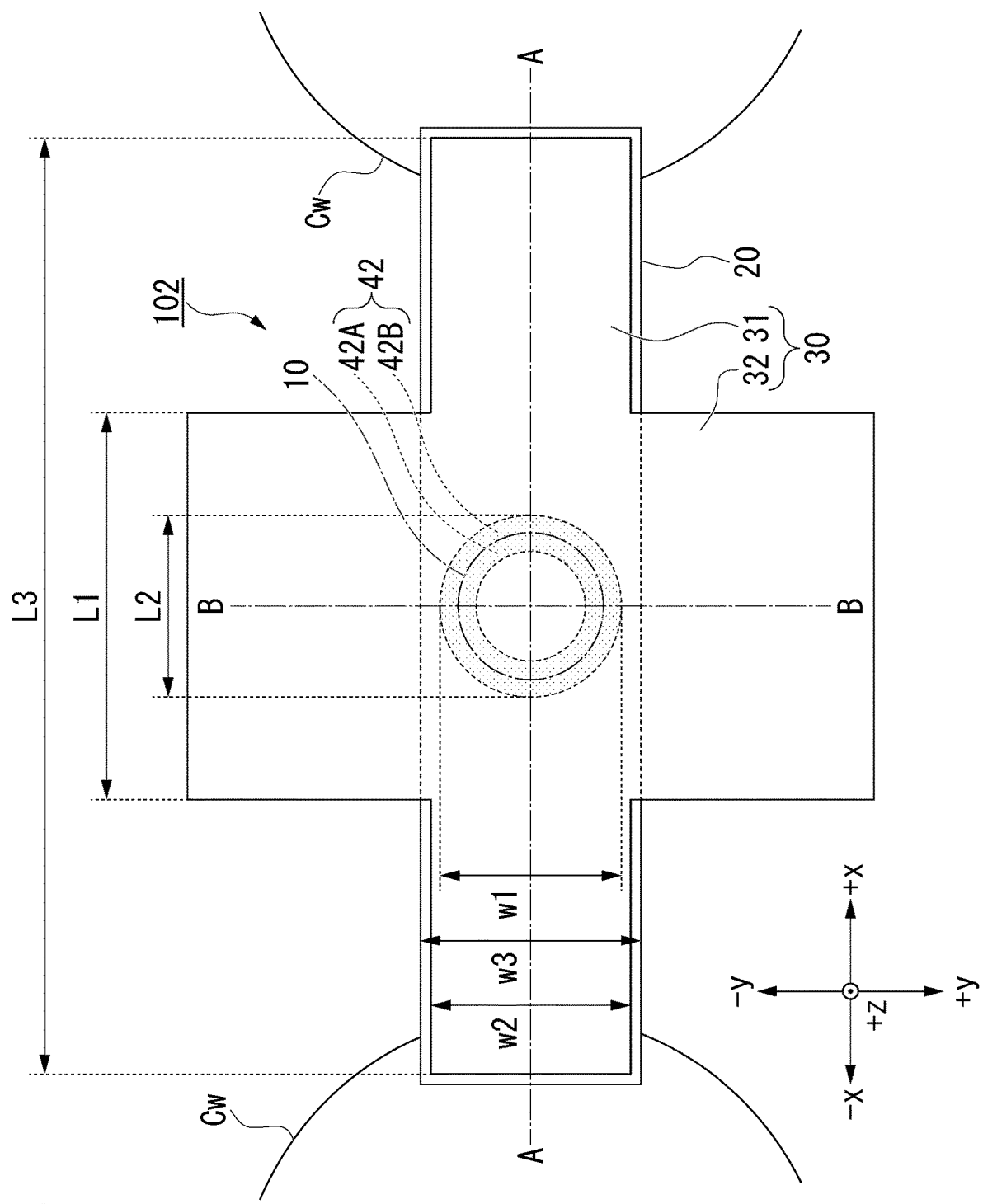
FIG. 13 is a plan view of a storage element according to a second modified example.
Figure 14:
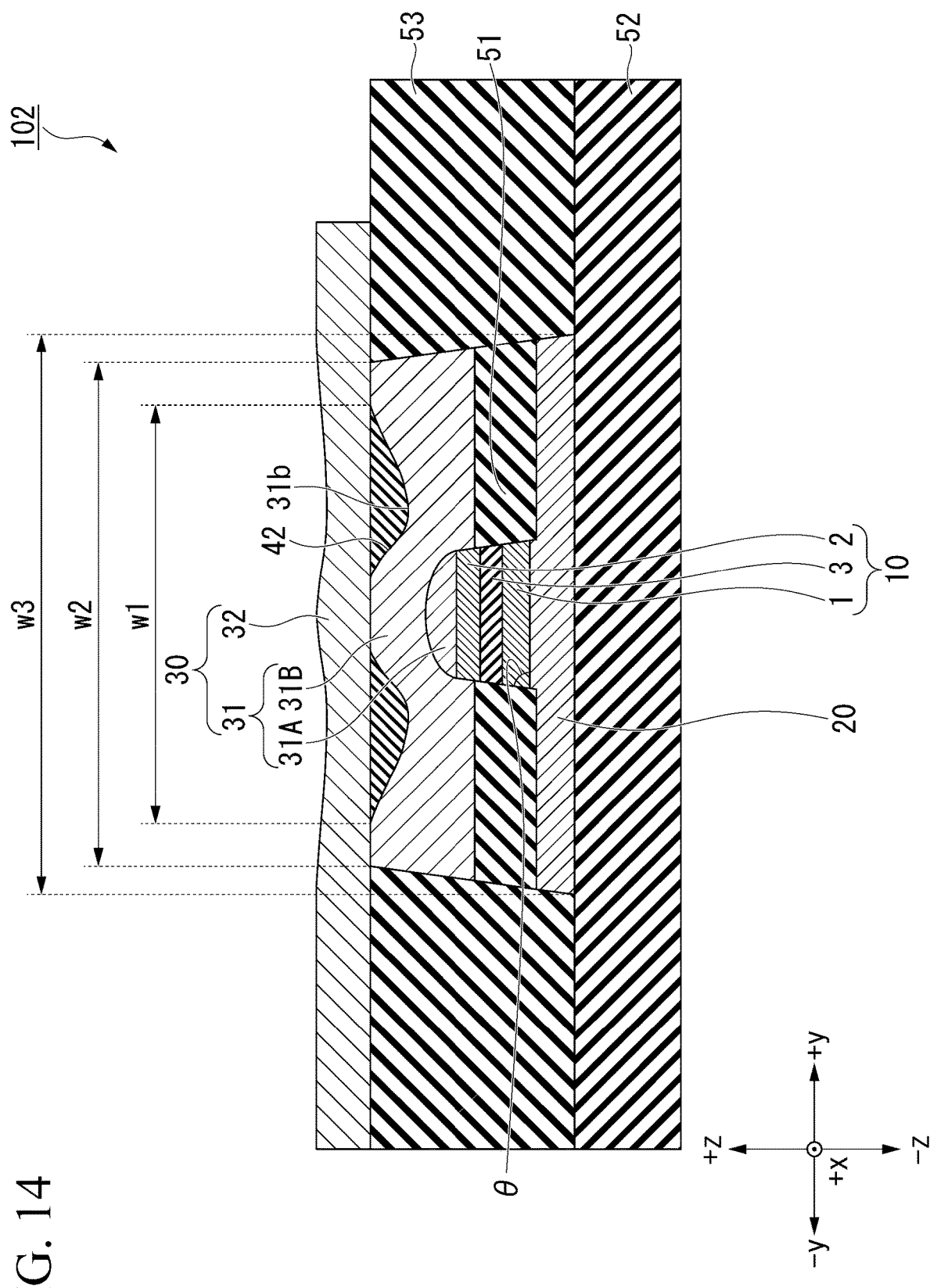
FIG. 14 is a cross-sectional view of the storage element according to the second modified example.

FIG. 13 is a plan view of a storage element 102 according to a second modified example. FIG. 14 shows a cross section of the storage element 102 cut along the yz plane (plane along the line B-B in FIG. 13) that passes through the center of the width of the first wiring 20 in the x direction. The storage element 102 according to the second modified example is different from the compound part 40 shown in FIG. 4 in the size of a compound part 42. The other components are the same as those in the storage element 100, the same components are denoted with the same reference numerals and descriptions thereof are omitted.

The compound part 42 is positioned inside the electrode 30. The compound part 42 is different from the compound part 40 in the storage element 100 in that the width w1 in the y direction is smaller than the width w2 of the first conductive part 31 and the width w3 of the first wiring 20. The other configurations, materials, and the like of the compound part 42 are the same as those of the compound part 40.

The compound part 42 when viewed in the z direction surrounds the periphery of the first ferromagnetic layer 1. For example, the compound part 42 when viewed in the z direction includes an overlapping part 42A overlapping the first ferromagnetic layer 1 and a non-overlapping part 42B with no overlapping.

Also in the second modified example, the compound part 42 minimizes escape of heat from the first ferromagnetic layer 1, and data writing efficiency is improved. When the width w2 of the first conductive part 31 is wider than the width w1 of a recess part 32a1 or the compound part 42, there are three connection parts between the first conductive part 31 and the second conductive part 32 in the y direction. When the number of connection parts between the second conductive part 32 and the first conductive part 31 increases, a local read current concentration can be minimized. In addition, when a plurality of paths for a read current are secured, it is possible to prevent flow of a read current from stopping even if any of the connection parts is separated due to distortion.

Figure 15:
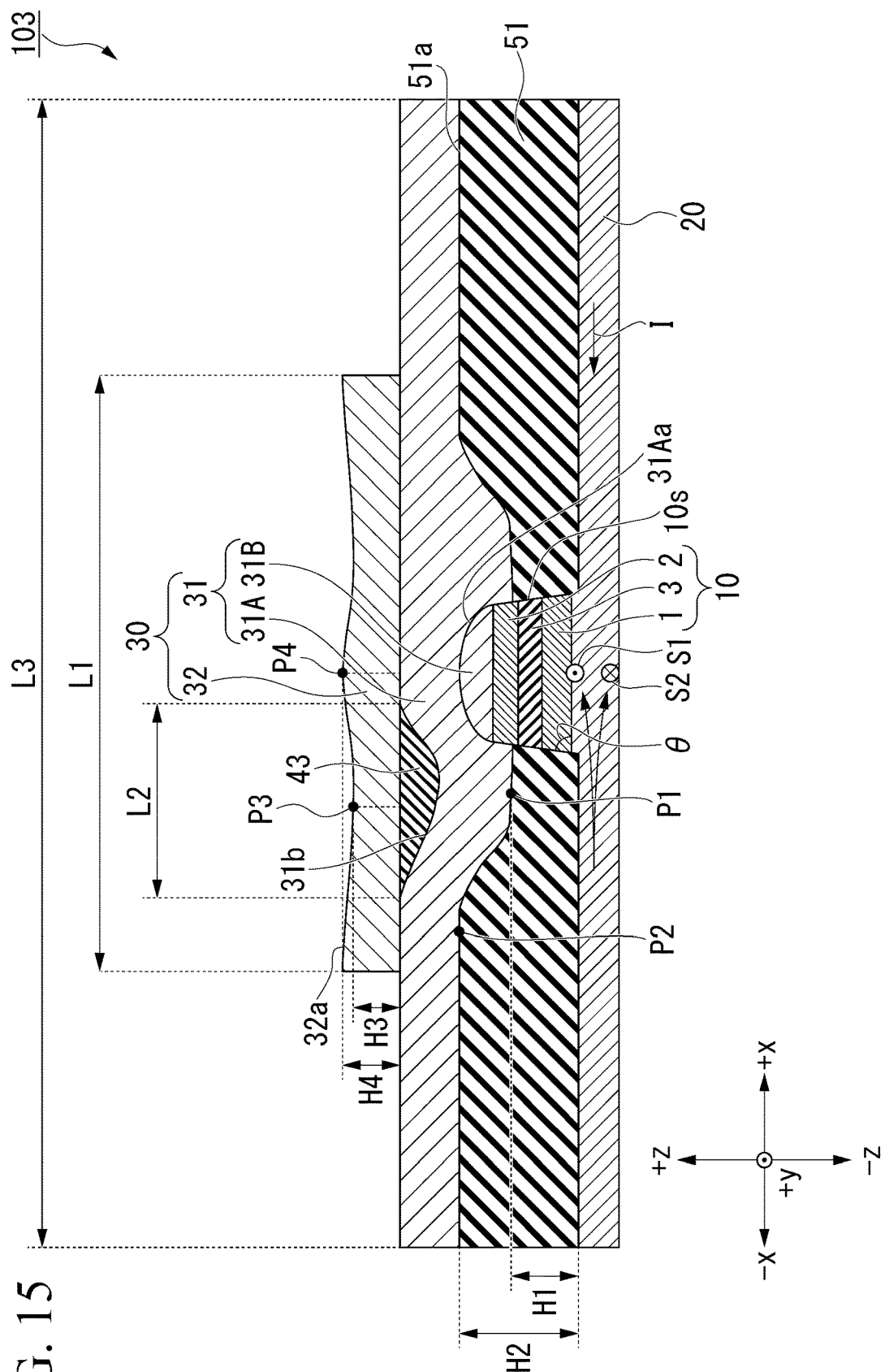
FIG. 15 is a cross-sectional view of a storage element according to a third modified example.

(Third modified example) FIG. 15 is a cross-sectional view of a storage element 103 according to a third modified example. FIG. 15 shows a cross section of the storage element 103 cut along the xz plane that passes through the center of the width of the first wiring 20 in the y direction. The storage element 103 according to the third modified example is different from the compound part 40 shown in FIG. 3 in that a compound part 43 is present only at a position of the magnetoresistance effect element 10 in the −x direction when viewed in the z direction. The other components are the same as those in the storage element 100, the same components are denoted with the same reference numerals and descriptions thereof are omitted.

The compound part 43 is positioned inside the electrode 30. The compound part 43 is located at a position of the magnetoresistance effect element 10 in the −x direction when viewed in the z direction. The compound part 43 minimizes escape of heat from the first ferromagnetic layer 1. Therefore, also in the third modified example, data writing efficiency is improved.

Fourth Modified Example

Figure 16:
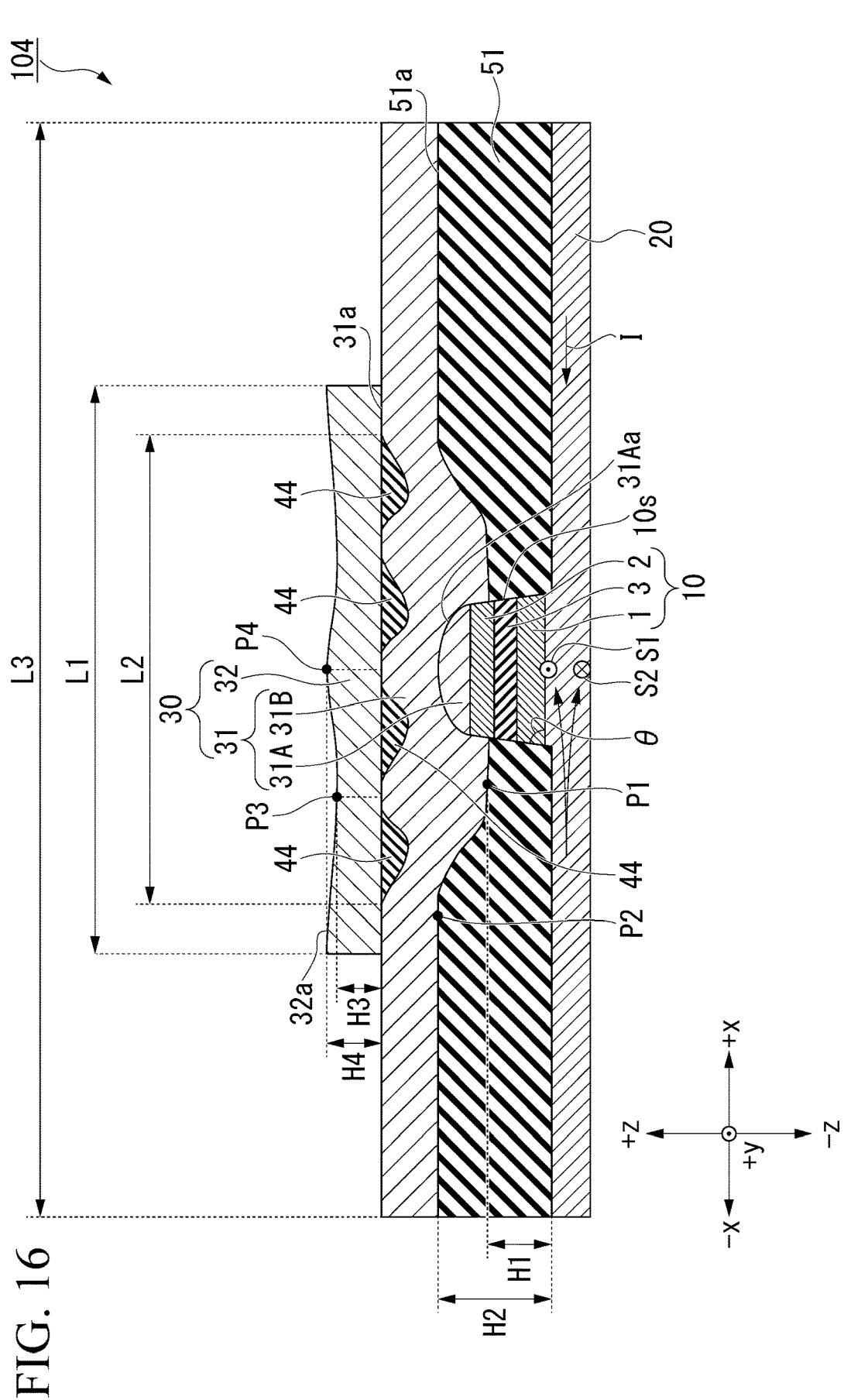
FIG. 16 is a cross-sectional view of a storage element according to a fourth modified example.

FIG. 16 is a cross-sectional view of a storage element 104 according to a fourth modified example. FIG. 16 shows a cross section of the storage element 104 cut along the xz plane that passes through the center of the width of the first wiring 20 in the y direction. The storage element 104 according to the fourth modified example is different from the compound part 40 shown in FIG. 3 in the configuration of a compound part 44.

The other components are the same as those in the storage element 100, the same components are denoted with the same reference numerals and descriptions thereof are omitted.

The compound part 44 is positioned inside the electrode 30. The compound part 44 is different from the compound part 40 shown in FIG. 3 in that there are a plurality of compound parts 44, and the other configurations are the same.

For example, the compound part 44 when viewed in the z direction is a double-ring surrounding the magnetoresistance effect element 10. In addition, the compound part 44 may extend in four lines in the y direction. The compound part 44 when viewed in the z direction sandwiches the first ferromagnetic layer 1 in the x direction. The compound part 44 can be formed by, for example, patterning.

A write current flows in the x direction along the first wiring 20. The first wiring 20 is a main heat generation source during writing in the storage element 101. When the compound part 44 is provided at a position at which the first ferromagnetic layer 1 is sandwiched in the x direction, it is possible to minimize escape of heat from the first ferromagnetic layer 1. Therefore, the storage element 104 has excellent data writing efficiency.

Figure 17:
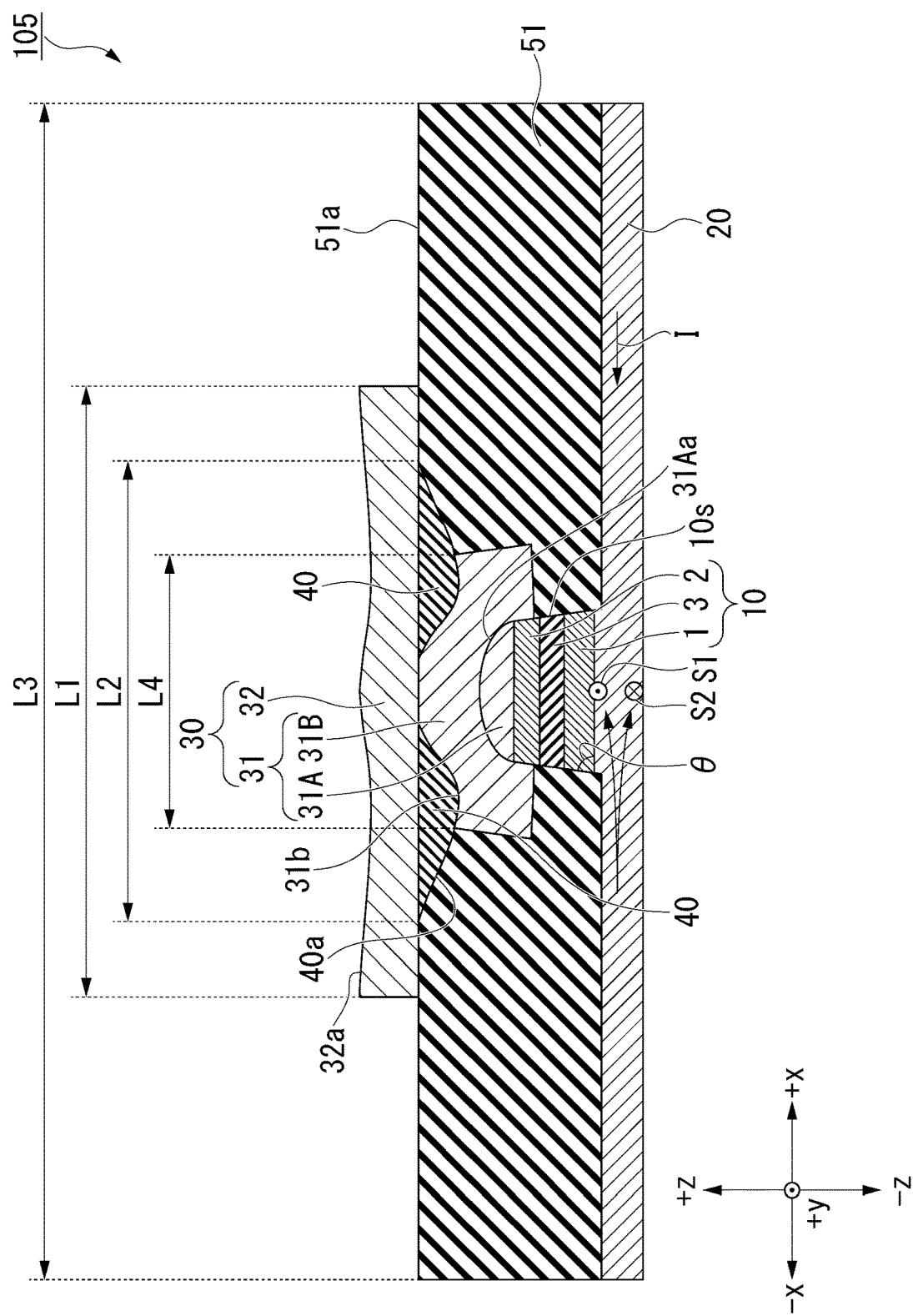
FIG. 17 is a cross-sectional view of a storage element according to a fifth modified example.

(Fifth modified example) FIG. 17 is a cross-sectional view of a storage element 105 according to a fifth modified example. FIG. 17 shows a cross section of the storage element 105 cut along the xz plane that passes through the center of the width of the first wiring 20 in the y direction. The storage element 105 according to the fifth modified example is different from the storage element 100 shown in FIG. 3 in the length of the second part 31B in the x direction. The other components are the same as those in the storage element 100, the same components are denoted with the same reference numerals and descriptions thereof are omitted.

A length L4 of the second part 31B in the x direction is different from a length L1 of the first wiring 20 in the x direction. In addition, a length L4 of the second part 31B in the x direction is shorter than a length L3 of a third part 33 in the x direction.

Also in the fifth modified example, the compound part 40 is formed between the second part 31B and the second conductive part 32. The compound part 40 minimizes escape of heat from the first ferromagnetic layer 1 during writing. Therefore, the storage element 105 has excellent data writing efficiency.

Sixth Modified Example

Figure 18:
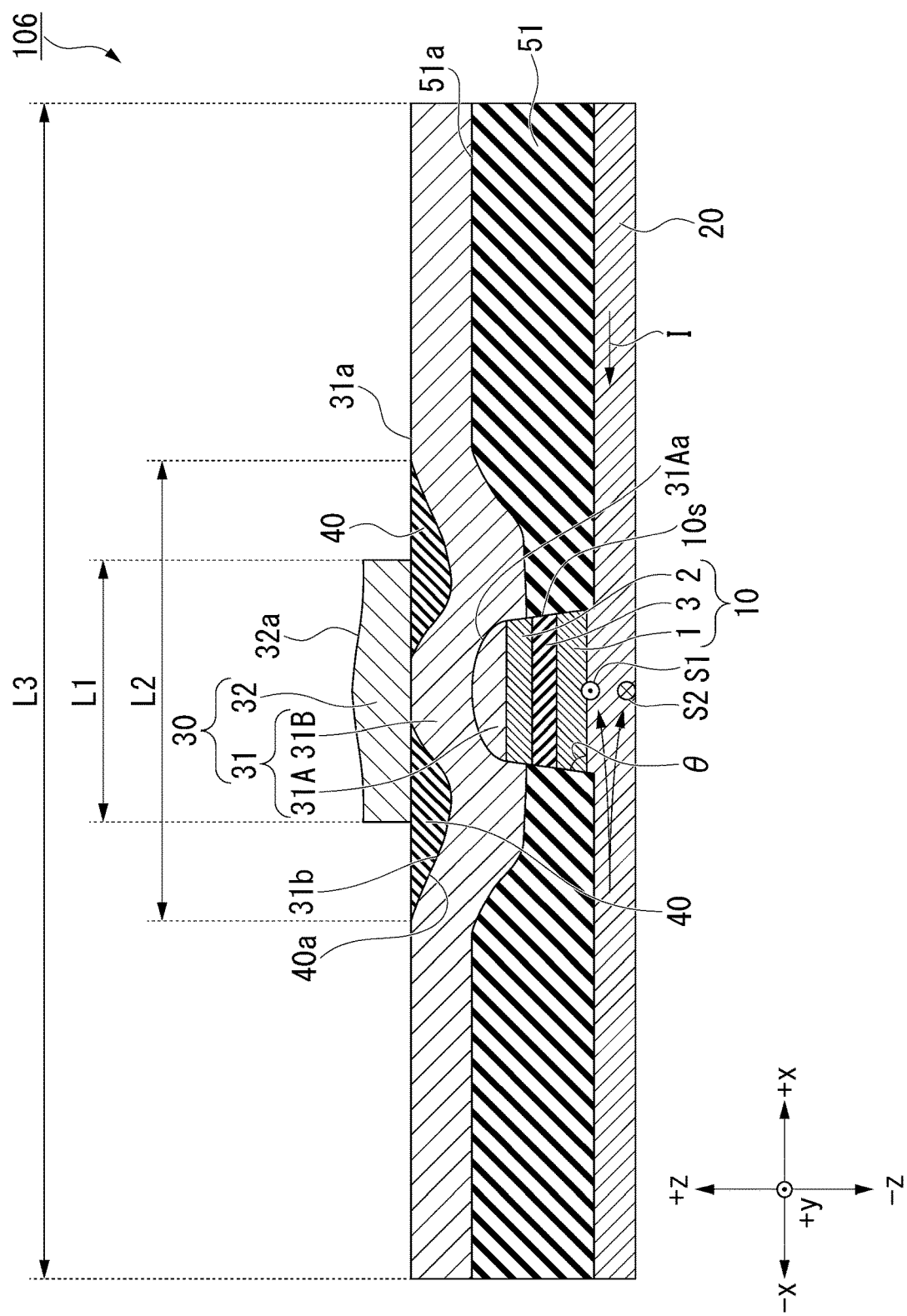
FIG. 18 is a cross-sectional view of a storage element according to a sixth modified example.

FIG. 18 is a cross-sectional view of a storage element 106 according to a sixth modified example. FIG. 18 shows a cross section of the storage element 106 cut along the xz plane that passes through the center of the width of the first wiring 20 in the y direction. The storage element 106 according to the sixth modified example is different from the storage element 100 shown in FIG. 3 in the length of the second conductive part 32 in the x direction. The other components are the same as those in the storage element 100, the same components are denoted with the same reference numerals and descriptions thereof are omitted.

The length L1 of the second conductive part 32 in the x direction is shorter than the distance L2 between the outmost parts of the compound part 40 in the x direction. There is one connection point between the second conductive part 32 and the second part 31B.

Also in the sixth modified example, the compound part 40 is formed between the second part 31B and the second conductive part 32. The compound part 40 minimizes escape of heat from the first ferromagnetic layer 1 during writing. Therefore, the storage element 106 has excellent data writing efficiency.

Seventh Modified Example

FIG. 19 is a cross-sectional view of a storage element 107 according to a seventh modified example. FIG. 19 shows a cross section of the storage element 107 cut along the xz plane that passes through the center of the width of the first wiring 20 in the y direction. The storage element 107 according to the seventh modified example is different from the electrode 30 and the compound part 40 shown in FIG. 3 in the configuration of an electrode 35 and the shape and position of a compound part 45. The other components are the same as those in the storage element 100, the same components are denoted with the same reference numerals and descriptions thereof are omitted.

The electrode 35 faces the second ferromagnetic layer 2 of the magnetoresistance effect element 10. For example, the electrode 35 is in contact with a first surface of the second ferromagnetic layer 2. The first surface is a surface of the second ferromagnetic layer 2 opposite to the nonmagnetic layer 3. At least a part of the electrode 35 sandwiches the second ferromagnetic layer 2 with the nonmagnetic layer 3. The electrode 35 is made of, for example, Cu, Al, or Au.

The compound part 45 is provided in the electrode 35. One compound part 45 is located at a position overlapping the first ferromagnetic layer 1. The shape of the compound part 45 in a plan view in the z direction can be any shape. The shape of the compound part 45 in a plan view in the z direction is, for example, a circular shape, an elliptical shape, or a rectangular shape. The material constituting the compound part 45 is the same as that of the compound part 40.

The compound part 45 can minimize escape of heat from the first ferromagnetic layer 1 during writing. Therefore, the storage element 106 has excellent data writing efficiency.

Here, the present invention is not limited to the above embodiments and modified example, and various modifications and alternations can be made in a range within the spirit and scope of the present invention described in the scope of the claims.

EXPLANATION OF REFERENCES

1 First ferromagnetic layer
2 Second ferromagnetic layer
3 Nonmagnetic layer
10 Magnetoresistance effect element
20 First wiring
30, 35 Electrode
31 First conductive part
31A First part
31B Second part
32 Second conductive part
40, 41, 42, 43, 44, 45 Compound part
40a First surface
40A, 41A, 42A Overlapping part
40B, 41B, 42B Non-overlapping part
50, 51, 52, 53 Insulating layer
100, 101, 102, 103, 104, 105 Storage element
110 First switching element
120 Second switching element
130 Third switching element
200 Semiconductor device
300 Magnetic recording array

What is claimed is:
1. A storage element, comprising:
a first ferromagnetic layer;
a second ferromagnetic layer;
a nonmagnetic layer that is sandwiched between the first ferromagnetic layer and the second ferromagnetic layer in a first direction;
a first wiring which extends in a second direction different from the first direction, and the first wiring being configured to sandwich the first ferromagnetic layer with the nonmagnetic layer in the first direction;
an electrode which sandwiches the second ferromagnetic layer at least partially with the nonmagnetic layer in the first direction; and
a compound part which is positioned inside the electrode and has a lower thermal conductivity than the electrode,
wherein the compound part does not overlap with a center of the second ferromagnetic layer in the first direction.

2. A storage element, comprising:
a first ferromagnetic layer;
a second ferromagnetic layer;
a nonmagnetic layer that is sandwiched between the first ferromagnetic layer and the second ferromagnetic layer in a first direction;
a first wiring which extends in a second direction different from the first direction, and the first wiring being configured to sandwich the first ferromagnetic layer with the nonmagnetic layer in the first direction;
an electrode which sandwiches the second ferromagnetic layer at least partially with the nonmagnetic layer in the first direction; and
a compound part which is positioned inside the electrode and has a lower thermal conductivity than the electrode,
wherein the electrode has a first conductive part and a second conductive part from a position close to the second ferromagnetic layer in that order,
wherein the second conductive part has a higher conductivity than the first conductive part, and
wherein the compound part is positioned between the first conductive part and the second conductive part.

3. The storage element according to claim 2,
wherein a first surface of the first conductive part on the side of the electrode forms a recess part that is recessed toward the first wiring with respect to a surface along a boundary between the first conductive part and the second conductive part, and
wherein the compound part is provided in the recess part.

4. The storage element according to claim 2,
wherein the first conductive part includes a first part overlapping the second ferromagnetic layer in the first direction and a second part which covers the first part and extends in the second direction.

5. The storage element according to claim 1,
wherein at least a part of the second ferromagnetic layer does not overlap the compound part in the first direction.

6. The storage element according to claim 1,
wherein the compound part includes a part overlapping the first ferromagnetic layer in the first direction.

7. The storage element according to claim 1,
wherein the compound part when viewed in the first direction sandwiches the first ferromagnetic layer in the second direction.

8. The storage element according to claim 1,
wherein the compound part when viewed in the first direction surrounds the first ferromagnetic layer.

9. The storage element according to claim 1,
wherein a first surface of the compound part on the side of the first wiring is curved.

10. The storage element according to claim 1,
wherein a thickness of the compound part at a first position in the first direction is thicker than a thickness of the compound part in the first direction at a second position farther from the first ferromagnetic layer than the first position.

11. The storage element according to claim 1,
wherein the first wiring contains any of a metal, an alloy, an intermetallic compound, a metal boride, a metal carbide, a metal silicide, and a metal phosphide which have a function of generating a spin current due to a spin Hall effect when a current flows.

12. A semiconductor device, comprising:
the storage element according to claim 1; and
a plurality of switching elements that are electrically connected to the storage element.

13. A magnetic recording array comprising a plurality of the storage elements according to claim 1.

14. The storage element according to claim 3,
wherein the first conductive part includes a first part overlapping the second ferromagnetic layer in the first direction and a second part which covers the first part and extends in the second direction.

15. The storage element according to claim 2,
wherein at least a part of the second ferromagnetic layer does not overlap the compound part in the first direction.

16. The storage element according to claim 3,
wherein at least a part of the second ferromagnetic layer does not overlap the compound part in the first direction.

17. The storage element according to claim 4,
wherein at least a part of the second ferromagnetic layer does not overlap the compound part in the first direction.

18. The storage element according to claim 2,
wherein the compound part includes a part overlapping the first ferromagnetic layer in the first direction.

19. The storage element according to claim 3,
wherein the compound part includes a part overlapping the first ferromagnetic layer in the first direction.

* * * * *